United States Patent
Kang et al.

(10) Patent No.: US 9,716,094 B2
(45) Date of Patent: Jul. 25, 2017

(54) SEMICONDUCTOR DEVICE HAVING CAPACITOR AND METHOD OF FABRICATING THE SEMICONDUCTOR DEVICE

(71) Applicant: Samsung Electronics Co., Ltd., Suwon-si, Gyeonggi-do (KR)

(72) Inventors: Sang-Yeol Kang, Suwon-si (KR); Ki-Vin Im, Seongnam-si (KR); Youn-Soo Kim, Yongin-si (KR); Han-Jin Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/229,424

(22) Filed: Aug. 5, 2016

(65) Prior Publication Data

US 2017/0098652 A1    Apr. 6, 2017

(30) Foreign Application Priority Data

Oct. 2, 2015  (KR) .......................... 10-2015-0139057

(51) Int. Cl.
*H01L 27/108*  (2006.01)
*H01L 49/02*  (2006.01)

(52) U.S. Cl.
CPC ........ *H01L 27/10805* (2013.01); *H01L 28/60* (2013.01)

(58) Field of Classification Search
CPC .......................... H01L 27/10805; H01L 28/60
See application file for complete search history.

(56) References Cited

U.S. PATENT DOCUMENTS

| | | | |
|---|---|---|---|
| 5,536,671 A | 7/1996 | Park | |
| 5,604,145 A | 2/1997 | Hashizume et al. | |
| 6,404,002 B2 | 6/2002 | Hahn | |
| 7,064,028 B2* | 6/2006 | Ito | H01L 28/91 257/E21.019 |
| 7,312,130 B2 | 12/2007 | Kim et al. | |
| 7,420,237 B2* | 9/2008 | Nagano | H01L 28/65 257/295 |
| 7,488,664 B2 | 2/2009 | Cook et al. | |
| 7,795,090 B2 | 9/2010 | Lin et al. | |
| 7,871,891 B2* | 1/2011 | Cho | H01L 27/0207 257/301 |

(Continued)

FOREIGN PATENT DOCUMENTS

| | | |
|---|---|---|
| JP | 08-204148 | 8/1996 |
| JP | 2008-053264 | 3/2008 |

*Primary Examiner* — David Vu
(74) *Attorney, Agent, or Firm* — Myers Bigel, P.A.

(57) ABSTRACT

A semiconductor device having a capacitor includes a substrate which has a transistor, a first insulating pattern which is formed on the substrate and does not overlap a first contact node formed in the substrate, a second insulating pattern which is formed on the substrate, does not overlap a second contact node formed in the substrate, and is separated from the first insulating pattern, a first lower electrode which is formed on part of the substrate and sidewalls of the first insulating pattern, a second lower electrode which is formed on part of the substrate and sidewalls of the second insulating pattern, a dielectric layer pattern which is formed on the first lower electrode and the second lower electrode, and an upper electrode which is formed on the dielectric layer pattern. Related fabrication methods are also discussed.

20 Claims, 39 Drawing Sheets

(56) References Cited

U.S. PATENT DOCUMENTS

| | | |
|---|---|---|
| 7,939,910 B2 | 5/2011 | Cho et al. |
| 8,129,200 B2 | 3/2012 | Kang |
| 8,242,549 B2 | 8/2012 | Booth, Jr. et al. |
| 8,916,447 B2 | 12/2014 | Park et al. |
| 2015/0069316 A1 | 3/2015 | Lee et al. |

* cited by examiner

1200

1300

1400

SEMICONDUCTOR DEVICE HAVING CAPACITOR AND METHOD OF FABRICATING THE SEMICONDUCTOR DEVICE

CLAIM OF PRIORITY

This application claims priority from Korean Patent Application No. 10-2015-0139057 filed on Oct. 2, 2015 in the Korean Intellectual Property Office, the disclosure of which is incorporated by reference herein in its entirety.

BACKGROUND

1. Technical Field

The present inventive concepts relates to semiconductor devices having a capacitor and methods of fabricating the semiconductor device.

2. Description of the Related Art

As semiconductor elements have higher capacity and are more highly integrated, design rules may be reduced. This trend in design rules may also occur in dynamic random access memories (DRAMs) which are one type of semiconductor memory element. In order for a DRAM to operate, more than a certain level of capacitance is required in each cell. An increase in capacitance may increase the amount of charge stored in a capacitor, thereby improving refresh characteristics of a semiconductor element. The improved refresh characteristics of the semiconductor element can improve the yield of the semiconductor element.

The reliability of a capacitor may depend on two electrodes which define the capacitor and interface characteristics of a dielectric between the two electrodes. This is because electrical characteristics (such as leakage current) of the capacitor may be determined or otherwise affected by characteristics of the dielectric.

SUMMARY

Aspects of the present inventive concepts provide semiconductor devices having a capacitor structure which includes an increased space for depositing a dielectric layer.

Aspects of the present inventive concepts also provide semiconductor devices having a capacitor which includes a dielectric layer made of a high-k material.

Aspects of the present inventive concepts provide methods of fabricating semiconductor devices having a capacitor which includes a dielectric layer made of a high-k material.

However, aspects of the present inventive concepts are not restricted to the one set forth herein. The above and other aspects of the present inventive concepts will become more apparent to one of ordinary skill in the art to which the present inventive concepts pertains by referencing the detailed description of the present inventive concepts given below.

According to some embodiments of the present inventive concepts, a semiconductor device includes a substrate having transistors thereon, an interlayer insulating layer on the transistors, and contact nodes extending along a surface of the interlayer insulating layer. The contact nodes are electrically coupled to respective source/drain regions of the transistors. The semiconductor device further includes capacitor structures on the surface of the interlayer insulating layer. The capacitor structures respectively include an insulating pattern protruding away from the surface of the interlayer insulating layer, and a lower electrode on opposing sidewalls of the insulating pattern. The insulating pattern is a distinct structure from that of an adjacent one of the capacitor structures, and is positioned between respective ones of the contact nodes on the surface of the interlayer insulating layer. The opposing sidewalls of the insulating pattern including the lower electrode thereon are coplanar with those of the adjacent one of the capacitor structures.

In some embodiments, the opposing sidewalls of the insulating pattern may be first opposing sidewalls that are aligned with those of the adjacent one of the capacitor structures along a first direction. The insulating pattern may further include a second sidewall extending between the first opposing sidewalls thereof along a second direction intersecting the first direction. The second sidewall may face that of the adjacent one of the capacitor structures.

In some embodiments, the capacitor structures may further include a dielectric layer pattern on the lower electrode, and an upper electrode on the dielectric layer pattern. The dielectric layer pattern and the upper electrode may continuously extend between the capacitor structures on the substrate.

In some embodiments, the second sidewall of the insulating pattern may include the dielectric layer pattern thereon but may be free of the lower electrode.

In some embodiments, the insulating pattern may not overlap with the respective ones of the contact nodes in plan view. An upper surface of the insulating pattern may be free of the lower electrode such that the lower electrode may define first and second conductive portions that may electrically contact the respective ones of the contact nodes and may be electrically isolated from each other.

In some embodiments, a portion of the dielectric layer pattern extending between capacitor structures may include a concave portion that extends towards the substrate beyond the upper surfaces of the insulating pattern, or may include a convex portion that extends away from the substrate.

In some embodiments, the first opposing sidewalls of the insulating pattern may extend parallel to each other, and the second sidewall of the insulating pattern may extend perpendicular to the first opposing sidewalls. The first and second conductive portions may continuously extend from the first opposing sidewalls of the insulating pattern, respectively, to and along surfaces of the respective ones of the contact nodes.

In some embodiments, the capacitor structures may further respectively include an insulating layer between the insulating pattern and the surface of the interlayer insulating layer. The insulating layer may extend between and may not overlap with the respective ones of the contact nodes in plan view.

In some embodiments, the dielectric layer pattern may include a material having a dielectric constant of about 1000 or more.

In some embodiments, the dielectric layer pattern may include a metal nitride layer and a metal oxide layer stacked on the metal nitride layer.

In some embodiments, the insulating pattern of the adjacent ones of the capacitor structures may include portions of a same layer.

According to some embodiment of the present inventive concepts, there is provided semiconductor devices having a capacitor including a substrate which has a transistor, a first insulating pattern which is formed on the substrate and does not overlap a first contact node formed in the substrate, a second insulating pattern which is formed on the substrate, does not overlap a second contact node formed in the substrate, and is separated from the first insulating pattern, a first lower electrode which is formed on part of the substrate and sidewalls of the first insulating pattern, a second lower electrode which is formed on part of the substrate and sidewalls of the second insulating pattern, a dielectric layer pattern which is formed on the first lower electrode and the second lower electrode, and an upper electrode which is formed on the dielectric layer pattern.

According to some embodiment of the present inventive concepts, there is provided semiconductor devices having a capacitor including a substrate which has a transistor, first and second insulating patterns which are formed on the substrate and separated from each other, a first lower electrode which is formed on a first surface of the first insulating pattern and is not formed on a second surface adjacent to the first surface, a second lower electrode which is not formed on a third surface of the second insulating pattern which faces the second surface and is formed on a fourth surface adjacent to the third surface, a dielectric layer pattern which is formed on the second and third surfaces to fill a space between the first and second insulating patterns, and an upper electrode which is formed on the dielectric layer pattern.

According to some embodiment of the present inventive concepts, there is provided semiconductor devices having a capacitor including a first insulating pattern which is formed on a substrate, a second insulating pattern which is formed on the substrate to be separated from the first insulating pattern in a first direction, a first lower electrode which is formed along sidewalls of the first insulating pattern in a height direction of the first insulating pattern and along the substrate in a second direction intersecting the first direction, a second lower electrode which is formed along sidewalls of the second insulating pattern in a height direction of the second insulating pattern and along the substrate in the second direction, a dielectric layer pattern which is formed on the first and second lower electrodes and between the first and second insulating patterns, and an upper electrode which is formed on the dielectric layer pattern.

According to some embodiment of the present inventive concepts, there is provided methods of fabricating semiconductor devices including forming a first insulating line and a second insulating line on a substrate having a transistor, conformally forming a lower electrode material on the substrate and the first and second insulating lines, removing at least part of the lower electrode material formed on upper surfaces of the first and second insulating lines and at least part of the lower electrode material formed on the substrate between the first insulating line and the second insulating line, forming first through fourth insulating patterns by cutting the first and second insulating lines in the second direction, forming a dielectric layer pattern on the first through fourth insulating patterns, and forming an upper electrode on the dielectric layer pattern, wherein the first insulating line extends in a first direction, and the second insulating line is separated from the first insulating line in a second direction intersecting the first direction and extends in the first direction.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EMBODIMENTS

Figure 1:
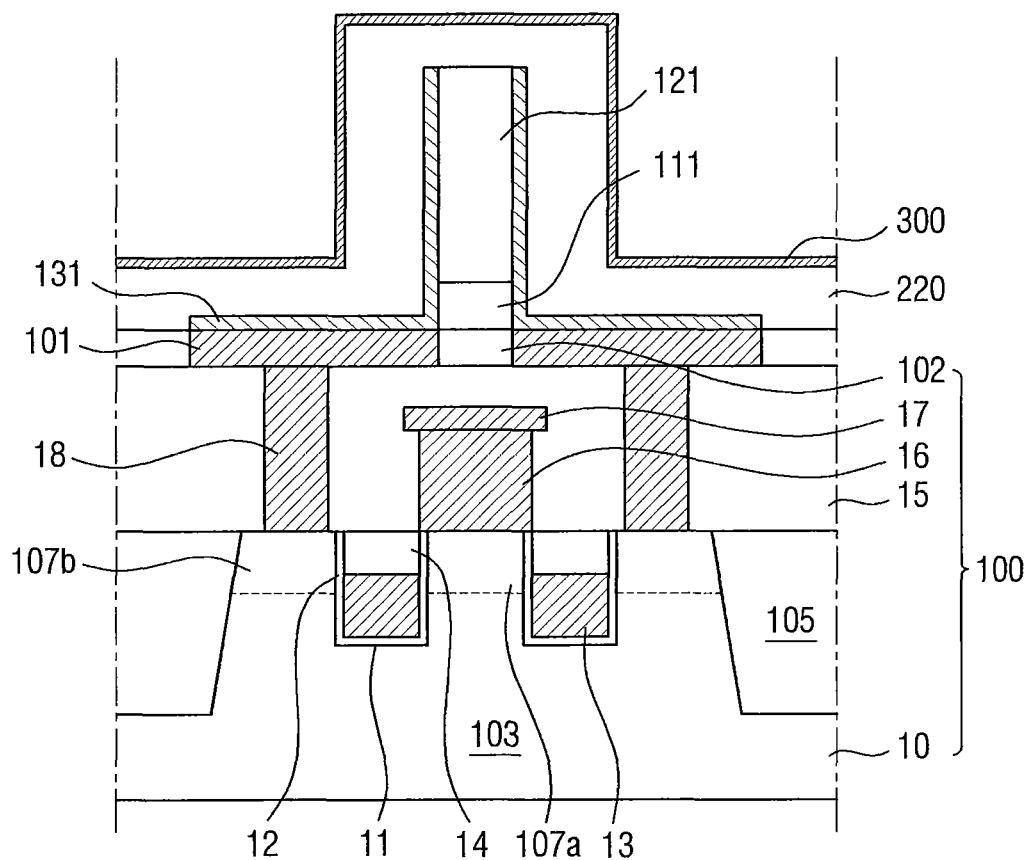
FIG. 1 is a cross-sectional view of semiconductor devices according to embodiments of the present inventive concepts.

The present inventive concepts will now be described more fully hereinafter with reference to the accompanying drawings, in which embodiments of the inventive concepts are shown. These inventive concepts may, however, be embodied in different forms and should not be construed as limited to embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" or "connected to" another element (e.g., a layer or substrate), it can be directly on the other element, or intervening elements may also be present. In contrast, when an element is referred to as being "directly on" or "directly connected to" another element, there are no intervening elements present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar references herein are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "and/or" includes any and all combinations of one or more of the associated listed items.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless defined otherwise, all technical and scientific terms used herein have the same meaning as commonly understood by one of ordinary skill in the art to which these inventive concepts belong. It is noted that the use of any and all examples, or example terms provided herein is intended merely to better illuminate the inventive concepts and is not a limitation on the scope of the inventive concepts unless otherwise specified. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present inventive concepts will be described with reference to perspective views, cross-sectional views, and/or plan views, in which embodiments of the inventive concepts are shown. Thus, the profile of an example view may be modified according to manufacturing techniques and/or allowances. That is, embodiments of the inventive concepts are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

FIG. 1 is a cross-sectional view of semiconductor devices according to embodiments of the present inventive concepts. According to embodiments of the present inventive concepts, in semiconductor devices having a capacitor, the capacitor may have an asymmetrically aligned structure. The asymmetrically aligned structure denotes a structure in which an insulating pattern 121 of the capacitor is misaligned with a contact node 101 electrically connected to an impurity region 107b. More specifically, the asymmetrically aligned structure denotes a structure in which the insulating pattern 121 of the capacitor does not overlap the contact node 101. In some conventional capacitor pillar structures, an insulating pillar structure may be formed on a contact node. In contrast, in the semiconductor device according to embodiments of the present inventive concepts, the asymmetrically aligned insulating pattern 121 is formed to not overlap the contact node 101.

Semiconductor devices (described below) according to embodiments of the present inventive concepts have an asymmetrically aligned capacitor structure. Accordingly, a dielectric layer and an upper electrode can be stacked on one side of a surface of a lower electrode. This is advantageous in securing a space in which the dielectric layer and the upper electrode are to be stacked. That is, since a pitch between lower electrodes is increased, a relatively thick dielectric layer material can be formed on the lower electrodes.

As a capacitor includes a thicker dielectric layer, the dielectric layer can be formed using a high-k material. Embodiments of the present inventive concepts can be applied to a 14 nanometer (nm) or less dynamic random access memory (DRAM) device.

In addition, in the semiconductor device according to embodiments of the present inventive concepts, an insulating pattern can be formed through patterning, thus making process management easy. Further, since the number of process steps is reduced, equipment investment cost can be saved.

Referring to FIG. 1, the semiconductor device according to embodiments of the present inventive concepts includes a substrate 100 having a transistor. An element isolation region 105 for defining a unit active region 103 may be included in the substrate 100.

The substrate 100 may have, but not limited to, a stacked structure of a base substrate 10 and an epitaxial layer. The base substrate 10 may be a silicon substrate, a gallium arsenide substrate, a silicon germanium substrate, a ceramic substrate, a quartz substrate, a glass substrate for displays, or a silicon-on-insulator (SOI) substrate. The silicon substrate will hereinafter be described as an example of the base substrate 10. In addition, the base substrate 10 may have, but not limited to, a first conductivity type (e.g., a P type).

The element isolation region 105 may include one or more of, e.g., oxide, nitride, and oxynitride. The element isolation region 105 may include a trench insulating layer and a trench liner in order to better insulate elements from each other.

A gate trench 11 may be included in the base substrate 10. The gate trench 11 may be formed across the unit active region 103 and the element isolation region 105. The gate trench 11 may be in the form of a line extending along a direction intersecting a direction in which the base substrate 10 extends.

A gate insulating layer 12 may be formed along sidewalls and a bottom surface of the gate trench 11. In addition, a gate electrode 13 may be formed on the gate insulating layer 12 to fill at least part of the gate trench 11. When the gate electrode 13 is formed to fill a part of the gate trench 11, a capping pattern 14 may be formed to fill the other part of the gate trench 11.

The gate insulating layer 12 may include one or more of, e.g., silicon oxide, silicon nitride, silicon oxynitride, and a high-k material. For example, the high-k material may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate electrode 13 may include, but not limited to, doped polysilicon, titanium nitride (TiN), tantalum nitride (TaN), tungsten nitride (WN), titanium (Ti), tantalum (Ta), or tungsten (W).

The capping pattern 14 may include an insulating material, for example, one or more of silicon oxide, silicon nitride, and silicon oxynitride.

In addition, a first impurity region 107a and the second impurity region 107b may be formed on both sides of the gate electrode 13. The first impurity region 107a may be formed in the unit active region 103 between two gate electrodes 13 which are formed across the unit active region 103. The second impurity region 107b may be formed between each of the gate electrodes 13 and the element isolation region 105. That is, two transistors formed in the unit active region 103 share the first impurity region 107a but do not share the second impurity region 107b.

In FIG. 1, the transistor is a buried channel array transistor (BCAT). However, the transistor is not limited to the BCAT. That is, the transistor can also be a transistor having a planar structure, a vertical channel array transistor (VCAT) formed in the pillar-shaped unit active region 103, or other transistors having various structures.

An interlayer insulating film 15 may be formed on the base substrate 10. The interlayer insulating film 15 may include one or more of, e.g., silicon oxide, silicon nitride, and silicon oxynitride. The interlayer insulating layer 15 may include a single layer or multiple layers.

A bit line contact 16 electrically connected to the first impurity region 107a may be formed in the interlayer insulating film 15. The bit line contact 16 may include a conductive material, for example, one or more of, but not limited to, polycrystalline silicon, a metal silicide compound, conductive metal nitride, and a metal.

A bit line 17 may be formed on the bit line contact 16 and electrically connected to the first impurity region 107a by the bit line contact 16. The bit line 17 may include a conductive material, for example, one or more of, but not limited to, polycrystalline silicon, a metal silicide compound, conductive metal nitride, and a metal.

A contact plug 18 may be formed in the interlayer insulating film 15 to penetrate through the interlayer insulating film 15. The contact plug 18 may be electrically connected to the second impurity region 107b. The contact plug 18 may include a storage node contact. The contact plug 18 may include a conductive material, for example, one or more of, but not limited to, polycrystalline silicon, a metal silicide compound, conductive metal nitride, and a metal.

In FIG. 1, the contact plug 18 is illustrated as one integral structure. However, this is merely an example used for ease of description, and the present inventive concepts are not limited to this example. That is, the contact plug 18 can also be formed by connecting a plurality of plugs formed through different processes.

The contact node 101 may be formed on the contact plug 18. The contact node 101 may be integrally formed with the contact plug 18 or may be formed by a different process from the contact plug 18. The contact node 101 may electrically connect a lower electrode 131 and the contact plug 18. Accordingly, the lower electrode 131 may be electrically connected to the second impurity region 107b. The contact node 101 may be, but is not limited to, a global buried contact (GBC).

An insulating layer 102 may be formed between neighboring contact nodes 101. The insulating layer 102 may include one or more of, e.g., silicon oxide, silicon nitride, and silicon oxynitride.

The above-described components may be included within the substrate 100. That is, the substrate 100 may include the base substrate 10, the gate trench 11, the gate insulating layer 12, the gate electrode 13, the capping pattern 14, the interlayer insulating film 15, the bit line contact 16, the bit line 17, the contact plug 18, the element isolation region 105, the active region 103, the first impurity region 107a, the second impurity region 107b, the contact node 101, and the insulating layer 102.

A capacitor structure is formed on the substrate 100. The capacitor structure includes an insulating layer 111, the insulating pattern 121, the lower electrode 131, a dielectric layer pattern 220, and an upper electrode 300.

Since the capacitor structure is a characteristic feature of the semiconductor device according to embodiments of the present inventive concepts, the following description will focus on the capacitor structure included in the semiconductor device according to embodiments of the present inventive concepts.

The insulating layer 111 may be formed on the substrate 100 and between the insulating pattern 121 and the substrate 100. The insulating layer 111 may include one or more of, e.g., silicon oxide, silicon nitride, and silicon oxynitride.

Figure 34:
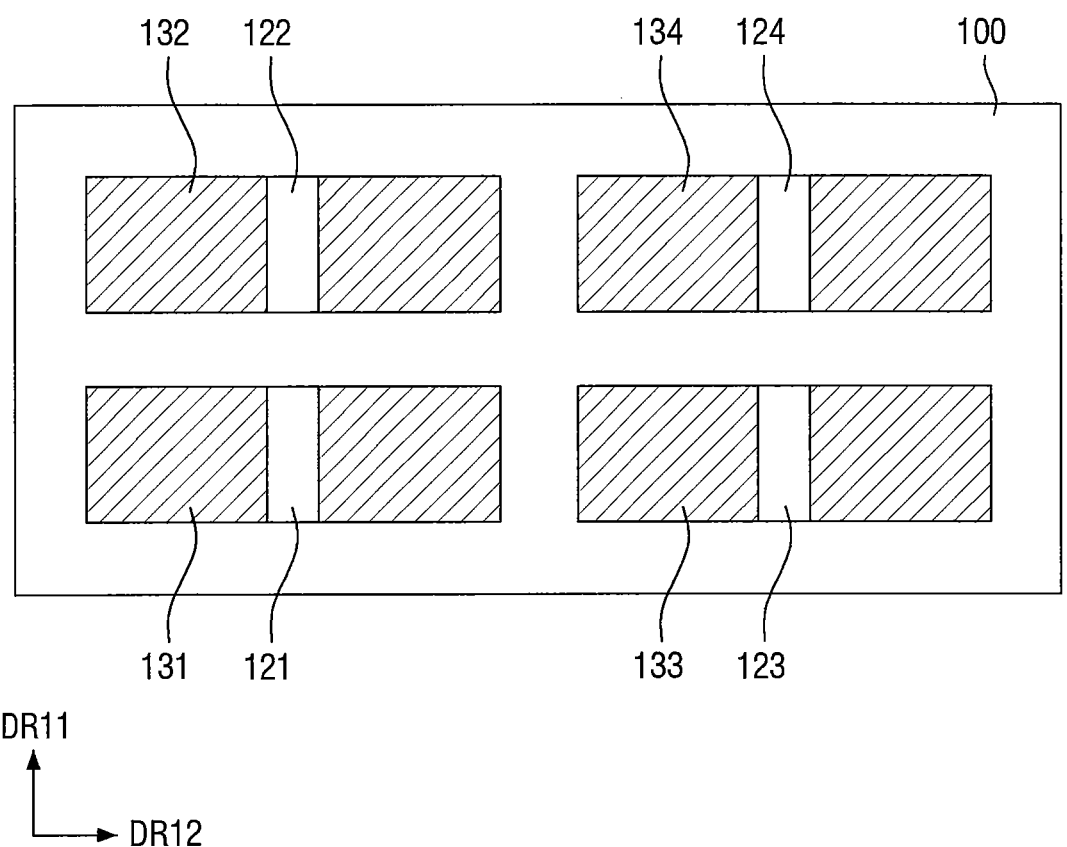
FIG. 34 is a layout view of semiconductor devices according to embodiments of the present inventive concepts.

The insulating pattern 121 may be formed on the insulating layer 111 and misaligned with the contact node 101 formed in the substrate 100. Here, when the insulating pattern 121 is misaligned with the contact node 101, it means that the insulating pattern 121 does not overlap the contact node 101. For example, when viewed in plan view (as shown in FIG. 34), the contact nodes 101 (having the lower electrodes 131-134 thereon) may not be obscured or obstructed by the insulating patterns 121-124 in some embodiments.

The lower electrode 131 may be formed on part of the substrate 100 and on sidewalls of the insulating pattern 121. That is, the lower electrode 131 may be conformally formed along the substrate 100 and the insulating pattern 121. The lower electrode 131 may be a layer made of a conductive material and may be electrically connected to the contact node 101. The lower electrode 131 may be made of a material including one or more of, but not limited to, TiN, Pt, Ru, RuO$_2$, SrRuO$_3$, Ir, IrO$_2$, ZnO, InSnO, MoN, NbN, TaN, ZrN, WN, and ScN.

The lower electrode 131 may be formed only on the sidewalls of the insulating pattern 121 and may not be formed on an upper surface of the insulating pattern 121. This is because a lower electrode formed on the upper surface of the insulating pattern 121 is removed by an etch-back process performed to form the lower electrode 131. Accordingly, the lower electrode 131 may be formed on the sidewalls of the insulating pattern 121, which are located opposite each other, and used as two storage electrodes.

The dielectric layer pattern 220 may be formed on the lower electrode 131. Specifically, the dielectric layer pattern 220 may be conformally formed along the substrate 100, the lower electrode 131, and the insulating pattern 121 to extend on or cover the substrate 100, the lower electrode 131, and the insulating pattern 121.

The dielectric layer pattern 220 may include a single layer or multiple layers. That is, the dielectric layer pattern 220 may include a metal nitride layer and a metal oxide layer stacked on the metal nitride layer, and each of the metal nitride layer and the metal oxide layer may be formed by atomic layer deposition (ALD). The metal nitride layer may be, but is not limited to, an aluminum nitride AlN) layer, a boron nitride (BN) layer, a zirconium nitride ($Zr_3N_4$) layer, or a hafnium nitride ($Hf_3N_4$) layer. The metal oxide layer may be, but is not limited to, a single layer selected from the group consisting of a $ZrO_2$ layer, a $HfO_2$ layer and a $Ta_2O_3$ layer, or a combination of these layers.

The upper electrode 300 may be formed on the dielectric layer pattern 220. That is, the upper electrode 300 may be conformally formed along the dielectric layer pattern 220. The upper electrode 300 may be made of a material including one or more of, but not limited to, TiN, Pt, Ru, $RuO_2$, $SrRuO_3$, Ir, $IrO_2$, ZnO, InSnO, MoN, NbN, TaN, ZrN, WN, and ScN.

Hereinafter, a case where the above-described capacitor structure is formed in a plurality of will be described. Accordingly, the capacitor structure included in semiconductor devices according to embodiments of the present inventive concepts will be described in greater detail, and the semiconductor device according to embodiments of the present inventive concepts will be described, focusing mainly on the capacitor structure.

Figure 2:
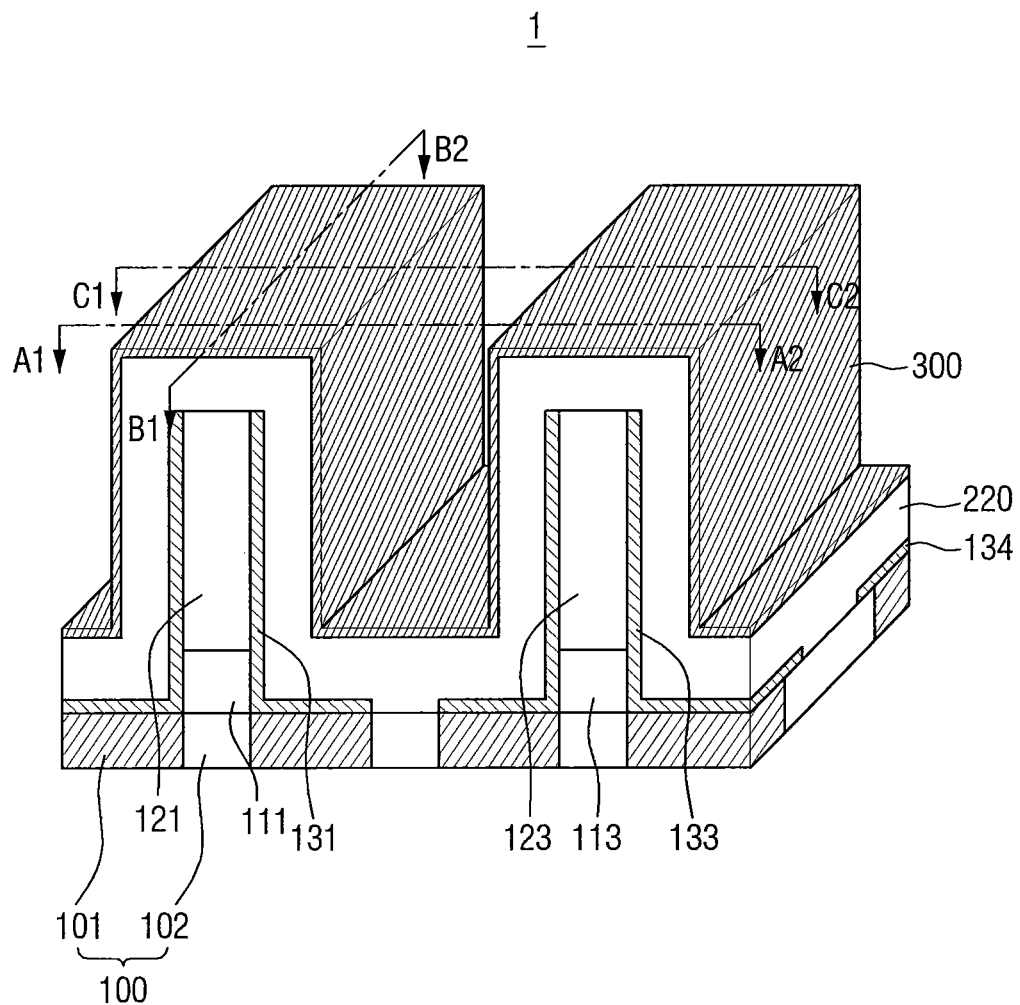
FIG. 2 is a perspective view of semiconductor devices according to embodiments of the present inventive concepts.
Figure 2:
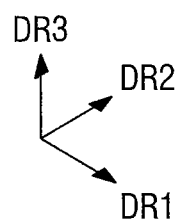
Figure 3:
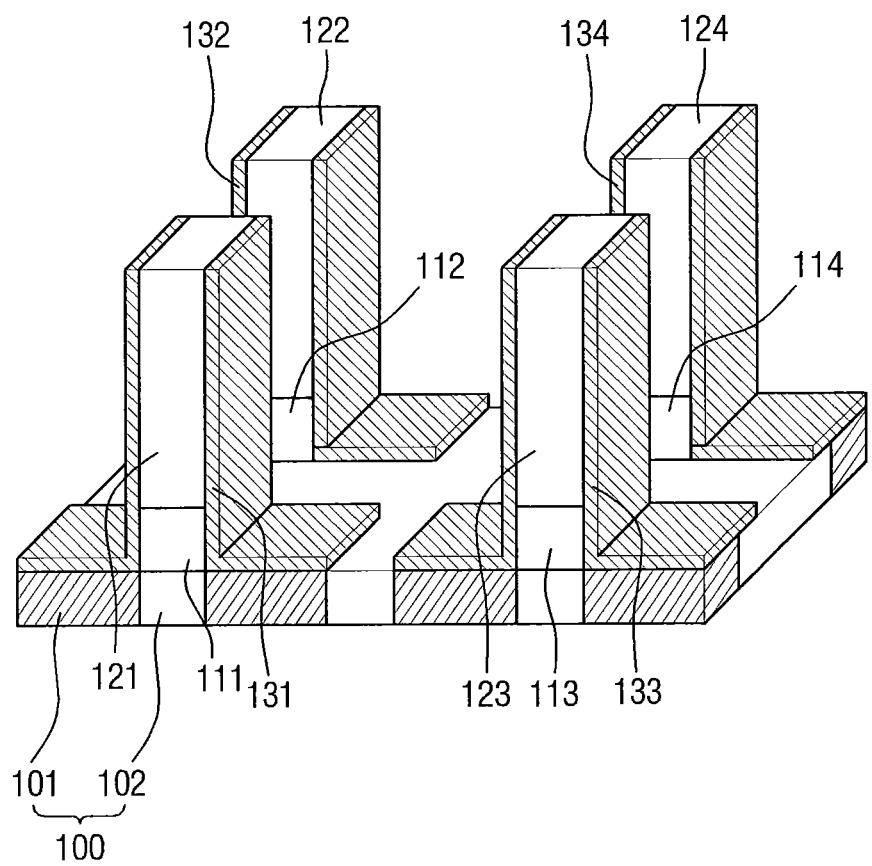
FIG. 3 is a perspective view of the semiconductor device having a dielectric layer pattern and an upper electrode removed from FIG. 2.
Figure 3:
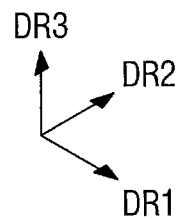

FIG. 2 is a perspective view of semiconductor devices according to embodiments of the present inventive concepts. FIG. 3 is a perspective view of the semiconductor device with the dielectric layer pattern 220 and an upper electrode 300 of FIG. 2 removed.

Referring to FIGS. 2 and 3, the semiconductor device according to embodiments of the present inventive concepts includes first through fourth insulating patterns 121 through 124, first through fourth lower electrodes 131 through 134, the dielectric layer pattern 220, and the upper electrode 300 which are formed on a substrate 100.

A first insulating layer 111 is formed between the first insulating pattern 121 and the substrate 100, a second insulating layer 112 is formed between the second insulating pattern 122 and the substrate 100, a third insulating layer 113 is formed between the third insulating pattern 123 and the substrate 100, and a fourth insulating layer 114 is formed between the fourth insulating pattern 124 and the substrate 100.

Here, each of the first through fourth insulating patterns 121 through 124 is misaligned with a corresponding contact node 101 disposed thereunder, and the first through fourth insulating patterns 121 through 124 are separated from each other.

The first lower electrode 131 is formed on both sidewalls of the first insulating pattern 121 which are located opposite each other and is not formed on the other sidewalls of the first insulating pattern 121 which are adjacent to the sidewalls on which the first lower electrode 131 is formed. The first lower electrode 131 is electrically connected to a corresponding contact node 101 disposed thereunder. That is, the first lower electrode 131 is formed along part of the substrate 100 and the sidewalls of the first insulating pattern 121 and is not formed on an upper surface of the first insulating pattern 121. Therefore, the first lower electrode 131 has an 'L'-shaped cross-section. Depending on processes, part of the material of the first lower electrode 131 can remain on the upper surface of the first insulating pattern 121.

The second lower electrode 132 is formed on both sidewalls of the second insulating pattern 122 which are located opposite each other and is not formed on the other sidewalls of the second insulating pattern 122 which are adjacent to the sidewalls on which the second lower electrode 132 is formed. The second lower electrode 132 is electrically connected to a corresponding contact node 101 disposed thereunder. That is, the second lower electrode 132 is formed along part of the substrate 100 and the sidewalls of the second insulating pattern 122 and is not formed on an upper surface of the second insulating pattern 122. Therefore, the second lower electrode 132 has an 'L'-shaped cross-section. Depending on processes, part of the material of the second lower electrode 132 can remain on the upper surface of the second insulating pattern 122. As shown in FIG. 3, the first insulating pattern 121 and the second insulating pattern 122 are distinct or separate structures protruding away from the substrate 100; however, opposing sidewalls of the first insulating pattern 121 and the second insulating pattern 122 (which include the lower electrodes 131 and 132 thereon, respectively), are coplanar or otherwise aligned with each other.

The third lower electrode 133 is formed on both sidewalls of the third insulating pattern 123 which are located opposite each other and is not formed on the other sidewalls of the third insulating pattern 123 which are adjacent to the sidewalls on which the third lower electrode 133 is formed. The third lower electrode 133 is electrically connected to a corresponding contact node 101 disposed thereunder. That is, the third lower electrode 133 is formed along part of the substrate 100 and the sidewalls of the third insulating pattern 123 and is not formed on an upper surface of the third insulating pattern 123. Therefore, the third lower electrode 133 has an 'L'-shaped cross-section. Depending on processes, part of the material of the third lower electrode 133 can remain on the upper surface of the third insulating pattern 123.

The fourth lower electrode 134 is formed on both sidewalls of the fourth insulating pattern 124 which are located opposite each other and is not formed on the other sidewalls of the fourth insulating pattern 124 which are adjacent to the sidewalls on which the fourth lower electrode 134 is formed. The fourth lower electrode 134 is electrically connected to a corresponding contact node 101 disposed thereunder. That is, the fourth lower electrode 134 is formed along part of the substrate 100 and the sidewalls of the fourth insulating pattern 124 and is not formed on an upper surface of the fourth insulating pattern 124. Therefore, the fourth lower electrode 134 has an 'L'-shaped cross-section. Depending on processes, part of the material of the fourth lower electrode 134 can remain on the upper surface of the fourth insulating pattern 124. As shown in FIG. 3, the third insulating pattern 123 and the fourth insulating pattern 124 are distinct or separate structures protruding away from the substrate 100; however, opposing sidewalls of the third insulating pattern 123 and the fourth insulating pattern 124 (which include the lower electrodes 133 and 134 thereon, respectively), are coplanar or otherwise aligned with each other.

According to the above structure, the first through fourth lower electrodes 131 through 134 are separated from each other.

The dielectric layer pattern 220 is formed on the substrate 100, the first through fourth insulating patterns 121 through 124, and the first through fourth lower electrodes 131 through 134. The dielectric layer pattern 220 may include a single layer or multiple layers. That is, the dielectric layer pattern 220 may include a metal nitride layer and a metal oxide layer stacked on the metal nitride layer, and each of the metal nitride layer and the metal oxide layer may be formed by ALD. Here, a material contained in the dielectric layer pattern 220 may have a dielectric constant of 1000 or more. That is, since a space in which the dielectric layer pattern 220 can be deposited can be secured, the dielectric layer pattern 220 can be formed using a material having a relatively high dielectric constant.

The upper electrode 300 is formed on the dielectric layer pattern 220. That is, the upper electrode 300 may be conformally formed along the dielectric layer pattern 220. The upper electrode 300 may be made of a material including one or more of, but not limited to, TiN, Pt, Ru, $RuO_2$, $SrRuO_3$, Ir, $IrO_2$, ZnO, InSnO, MoN, NbN, TaN, ZrN, WN, and ScN.

Methods of fabricating semiconductor devices according to embodiments of the present inventive concepts will now be described with reference to FIGS. 4 through 30.

FIGS. 4 through 30 are views illustrating methods of fabricating semiconductor devices according to embodiments of the present inventive concepts.

Figure 4:
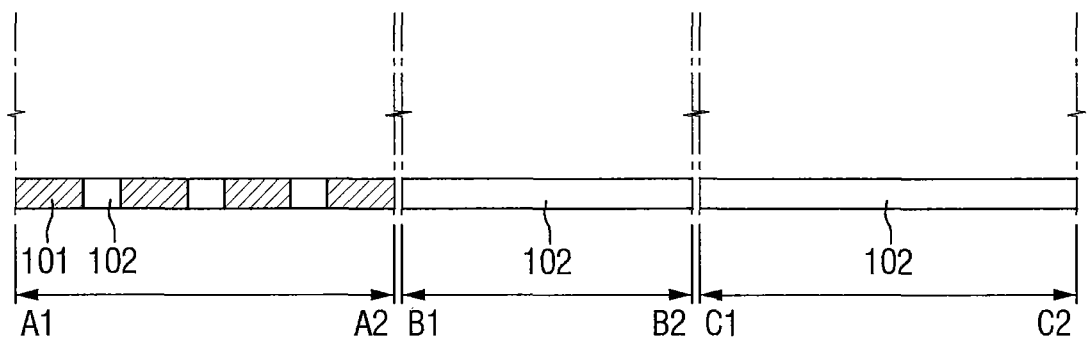
FIGS. 4 through 30 are views illustrating methods of fabricating semiconductor devices according to embodiments of the present inventive concepts.

FIG. 4 is a cross-sectional view taken along the lines A1-A2, B1-B2 and C1-C2 of FIG. 2, illustrating a substrate 100. Methods of fabricating the substrate 100 having transistors can be understood by those of ordinary skill in the art to which the present inventive concepts pertains, and thus the detailed structure of the substrate 100 will not be described here. The substrate 100 is substantially identical to that described above with reference to FIG. 1.

In FIG. 4, contact nodes 101 and an insulating layer 102 included in the substrate 100 are illustrated.

FIGS. 5 through 9 are cross-sectional views taken along the lines A1-A2, B1-B2 and C1-C2 of FIG. 2, illustrating a process of forming insulating layers 110 and insulating patterns 120. FIG. 10 is a perspective view of the insulating layers 110 and the insulating patterns 120 completed in FIG. 9.

Figure 5:
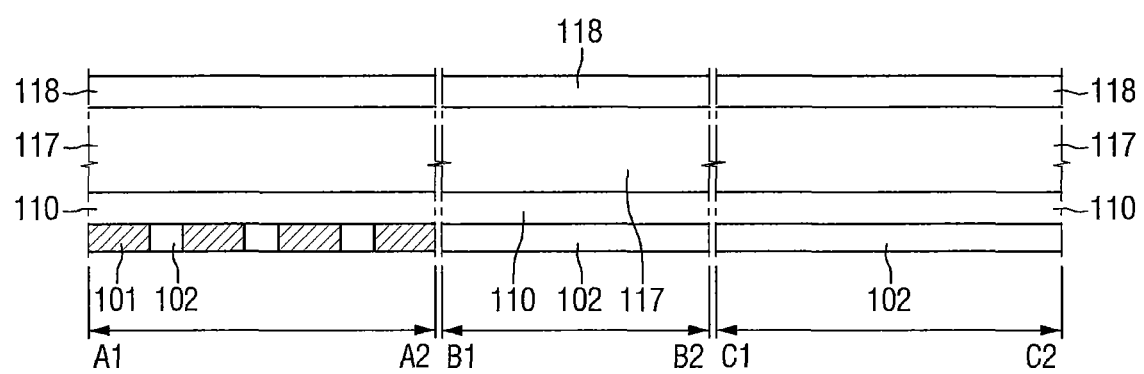

Referring to FIG. 5, an insulating layer 110 is deposited on the substrate 100, and a first mask layer 117 and a second mask layer 118 are sequentially deposited on the insulating layer 110. The first mask layer 117 may include, e.g., a spin-on-hard mask (SOH), and the second mask layer 118 may include, e.g., silicon oxynitride.

Figure 6:
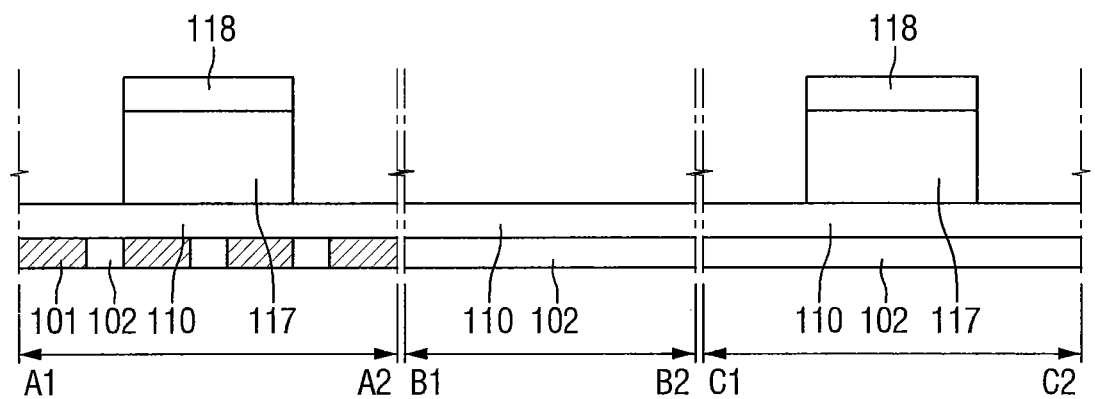

Referring to FIG. 6, the first mask layer 117 and the second mask layer 118 are partially removed using an etch process. The etch process may be a double patterning process used to form the insulating patterns 120 having a narrow width and pitch. The double patterning process can be understood by those of ordinary skill in the art to which the present inventive concepts pertains, and thus a detailed description thereof is omitted.

Figure 7:
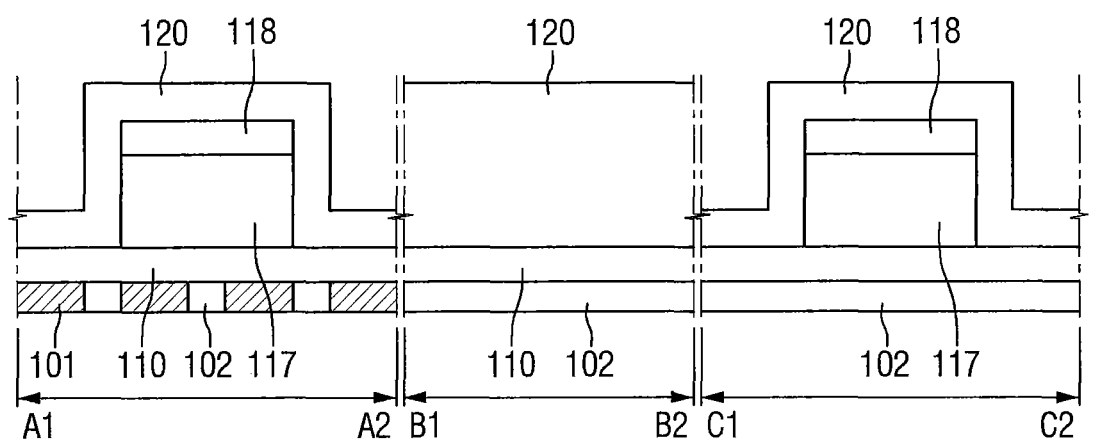

Referring to FIG. 7, an insulating pattern material (120) is deposited on the first and second mask layers 117 and 118 which have been partially removed. Here, the insulating pattern material (120) may include, e.g., $SiO_2$. The insulating layer pattern material (120) may be deposited on the first mask layer 117 and the second mask layer 118 by an ALD process.

Figure 8:
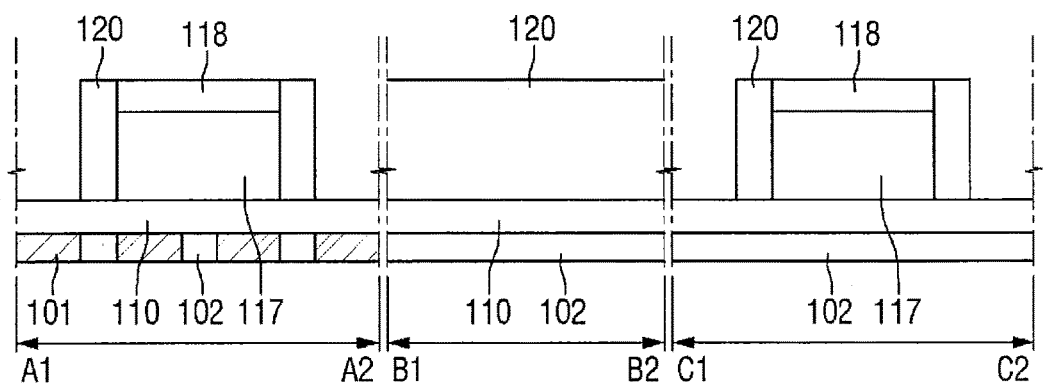

Referring to FIG. 8, the insulating pattern material (120) is partially removed using an etch-back process. In the etch-back process, portions of the insulating pattern material (120) disposed on the upper surface of the second mask layer 118 and on the upper surface of the insulating layer 110 may be removed, thus leaving the insulating patterns 120.

Figure 9:
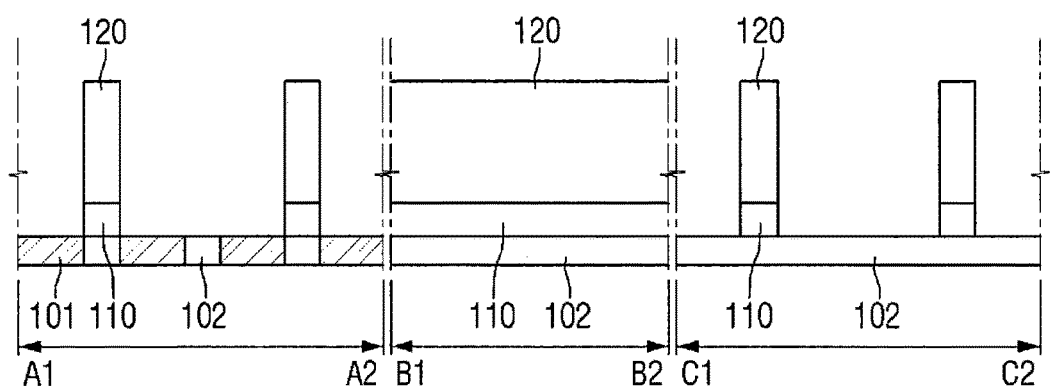
Figure 10:
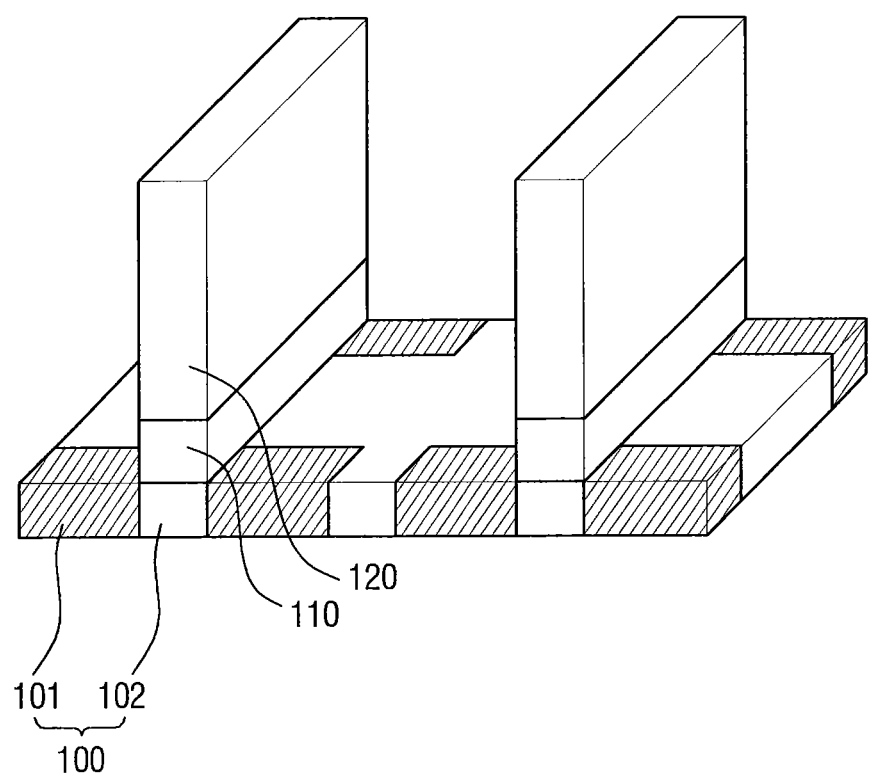

Referring to FIG. 9, the first mask layer 117 and the second mask layer 118 remaining between the insulating patterns 120 are removed using an etch process. In addition, the insulating layer 110 excluding portions covered with the insulating patterns 120 is removed. That is, portions of the insulating layer 110 that are exposed by the insulating patterns 120 are removed. Accordingly, the insulating patterns 120 may be formed on the substrate 100 in the structure illustrated in FIG. 10. The insulating layer 110 is formed between each of the insulating patterns 120 and the substrate 100.

Figure 11:
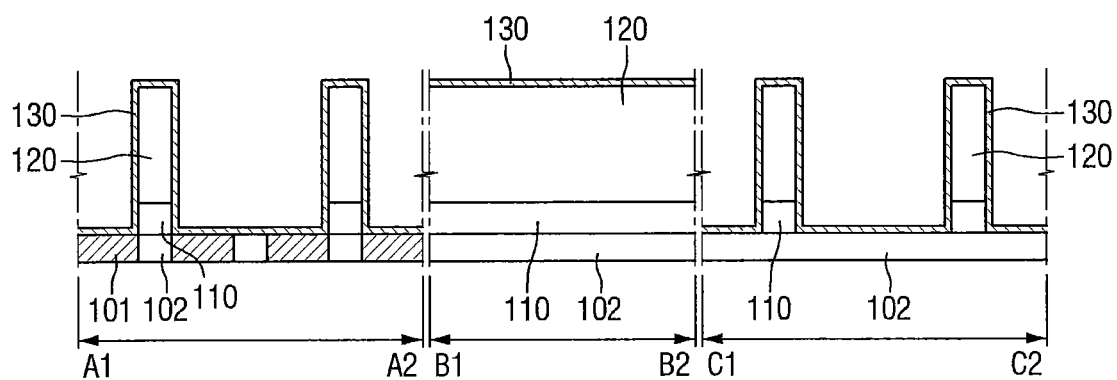
Figure 12:
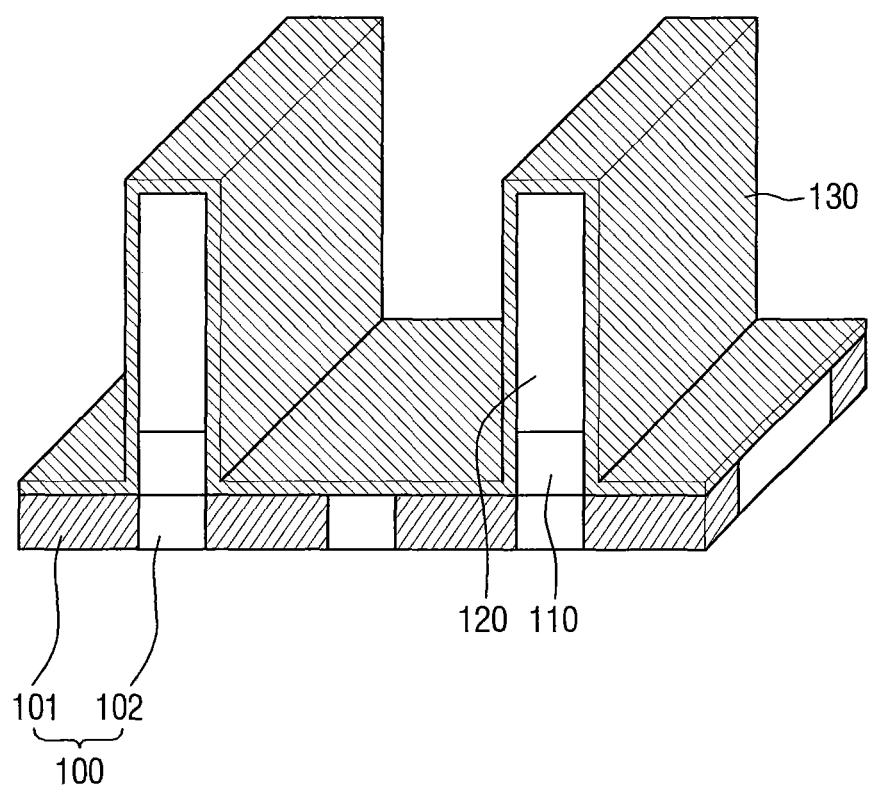

FIG. 11 is a cross-sectional view taken along the lines A1-A2, B1-B2 and C1-C2 of FIG. 2, illustrating a process of depositing a lower electrode material (130) on the insulating layer patterns 120. FIG. 12 is a perspective view of the lower electrode material (130) deposited in FIG. 11.

Referring to FIG. 11, the lower electrode material (130) is deposited on part of the substrate 100, the insulating layers 110, and the insulating patterns 120. The lower electrode material (130) may be conformally formed along part of the substrate 100, the insulating layers 110, and the insulating patterns 120. Accordingly, the lower electrode material (130) may be deposited as illustrated in FIG. 12.

Figure 13:
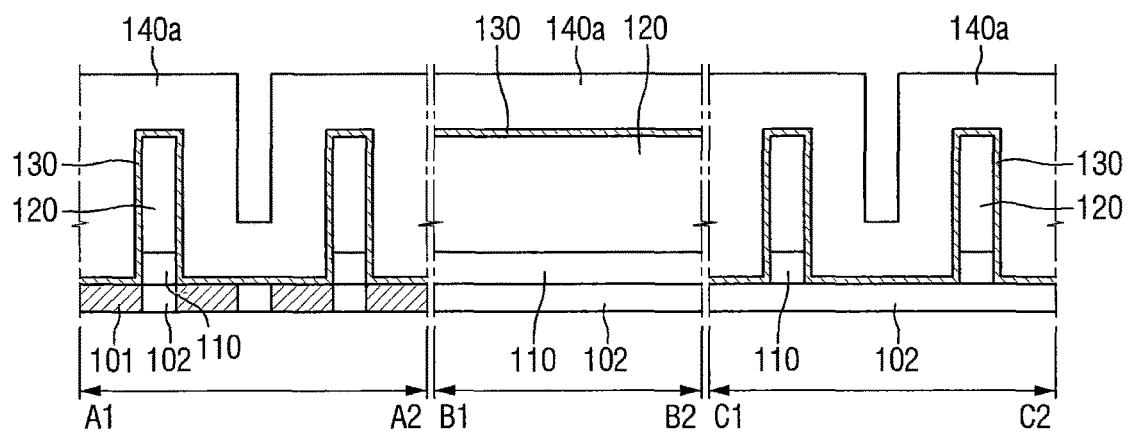
Figure 14:
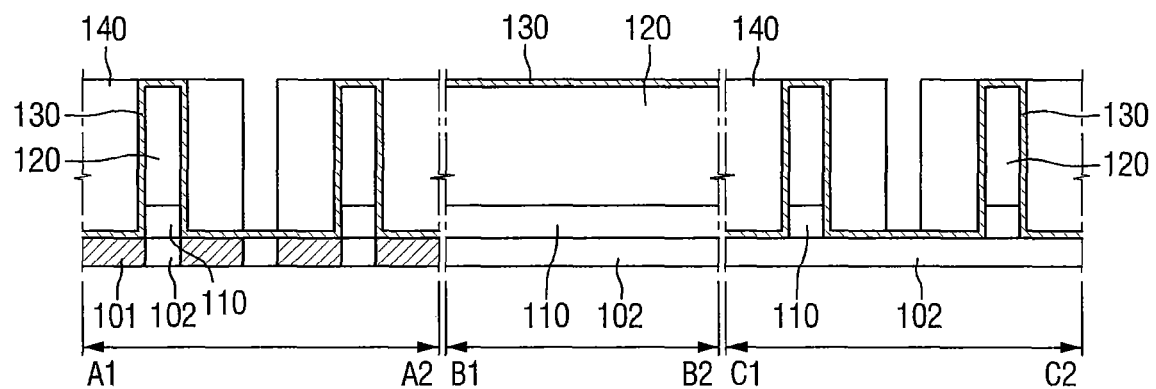
Figure 15:
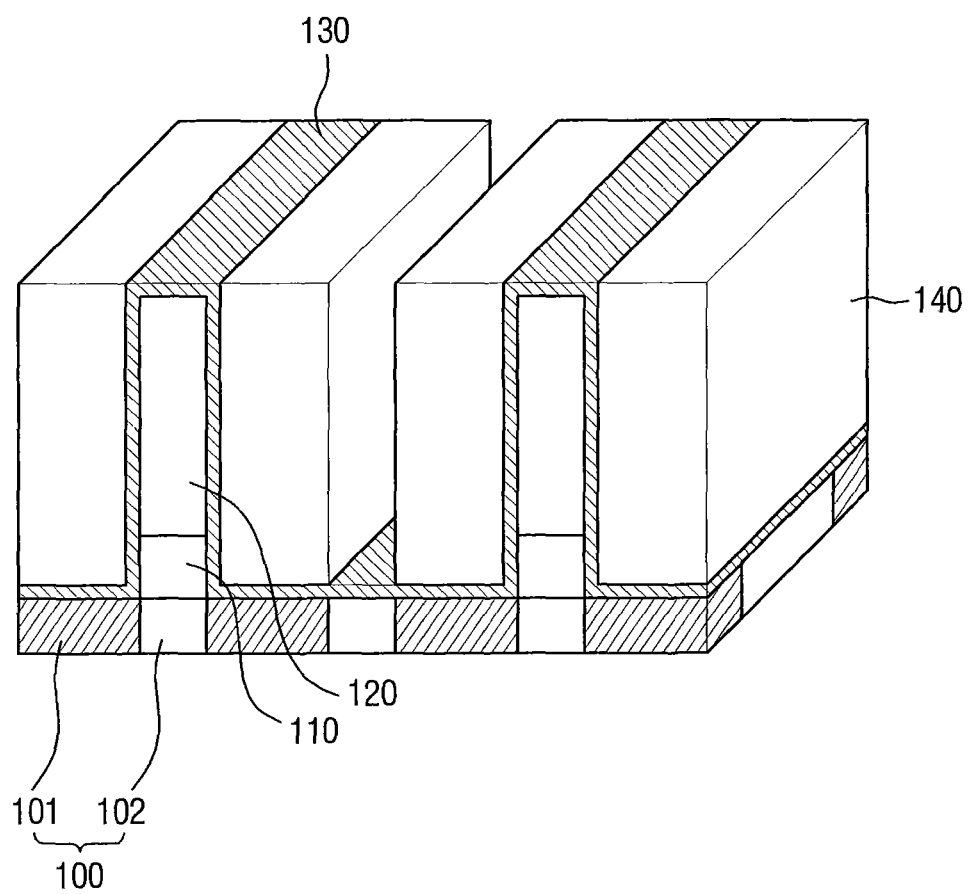

FIGS. 13 and 14 are cross-sectional views taken along the lines A1-A2, B1-B2 and C1-C2 of FIG. 2, illustrating a process of forming third mask layer patterns 140 on the lower electrode material (130). FIG. 15 is a perspective view of the third mask layer patterns 140 deposited on the lower electrode material (130) in FIG. 14.

Referring to FIG. 13, a third mask layer material 140a is deposited on the lower electrode material (130). That is, the third mask layer material 140a may be conformally formed on the lower electrode material (130). The third mask layer material 140a may include, e.g., polysilicon.

Referring to FIG. 14, the third mask layer material 140a is partially removed using an etch-back process. In the etch-back process, portions of the third mask layer material 140a disposed on the upper surface of the lower electrode material (130) may be removed, thus leaving the third mask layer patterns 140. Accordingly, the third mask layer patterns 140 may be formed on the lower electrode material (130) in the structure illustrated in FIG. 15.

Figure 16:
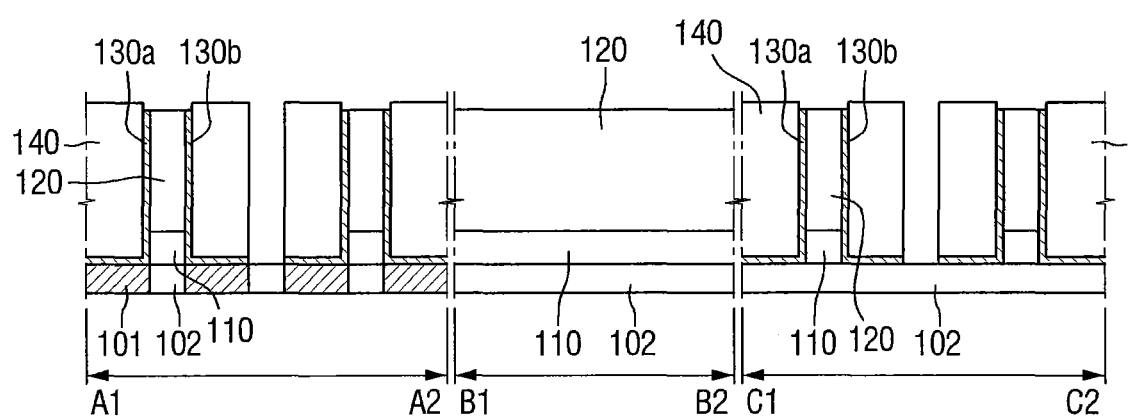
Figure 17:
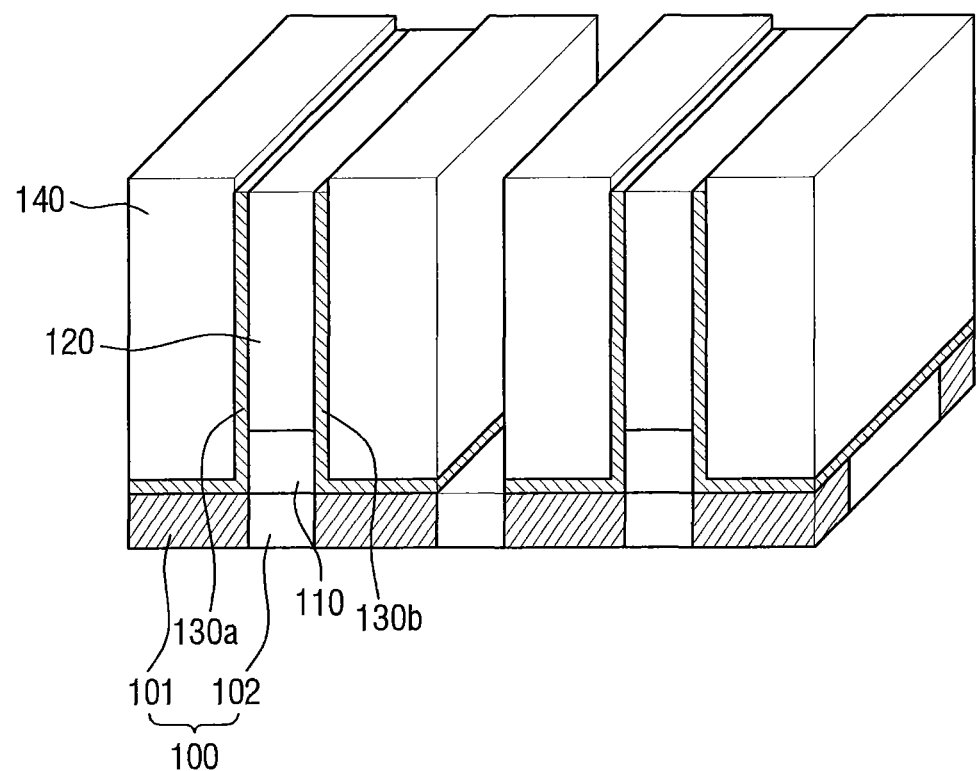

FIG. 16 is a cross-sectional view taken along the lines A1-A2, B1-B2 and C1-C2 of FIG. 2, illustrating a process of removing portions of the lower electrode material (130) which are exposed by the third mask layer patterns 140. FIG. 17 is a perspective view of the lower electrode material (130) partially removed in FIG. 16.

Referring to FIG. 16, the lower electrode material (130) is partially removed using an etch-back process. In the etch-back process, exposed portions of the lower electrode material (130) may be removed. That is, portions of the lower electrode material (130) which are not covered by the third mask layer patterns 140 may be removed, thereby forming lower electrode patterns 130a and 130b. Accordingly, electrically isolated lower electrode patterns 130a and 130b may be formed in the structure illustrated in FIG. 17.

Figure 18:
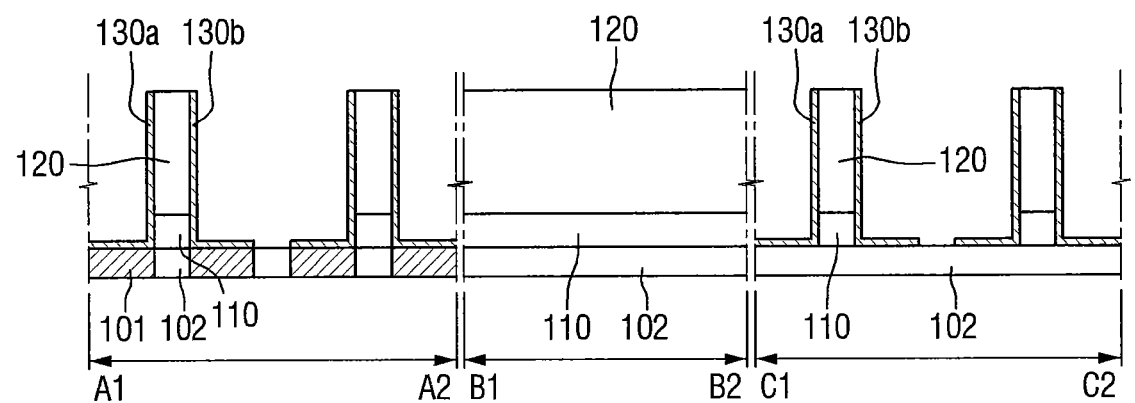
Figure 19:
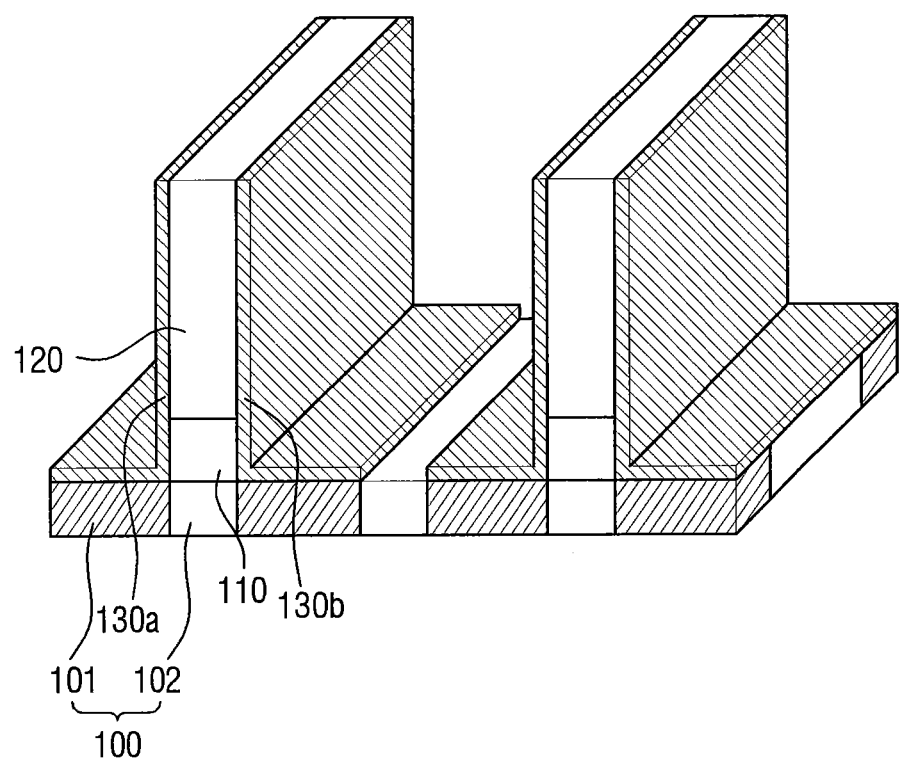

FIG. 18 is a cross-sectional view taken along the lines A1-A2, B1-B2 and C1-C2 of FIG. 2, illustrating a process of removing the third mask layer patterns 140. FIG. 19 is a perspective view of the resultant structure following the removal of the third mask layer patterns 140 in FIG. 18.

Referring to FIG. 18, the third mask layer patterns 140 are removed using a strip process. While the third mask layer patterns 140 are removed due to etch selectivity, the lower electrode patterns 130a and 130b may not be removed. Accordingly, the lower electrode patterns 130a and 130b may be completed in the structure illustrated in FIG. 19.

Figure 20:
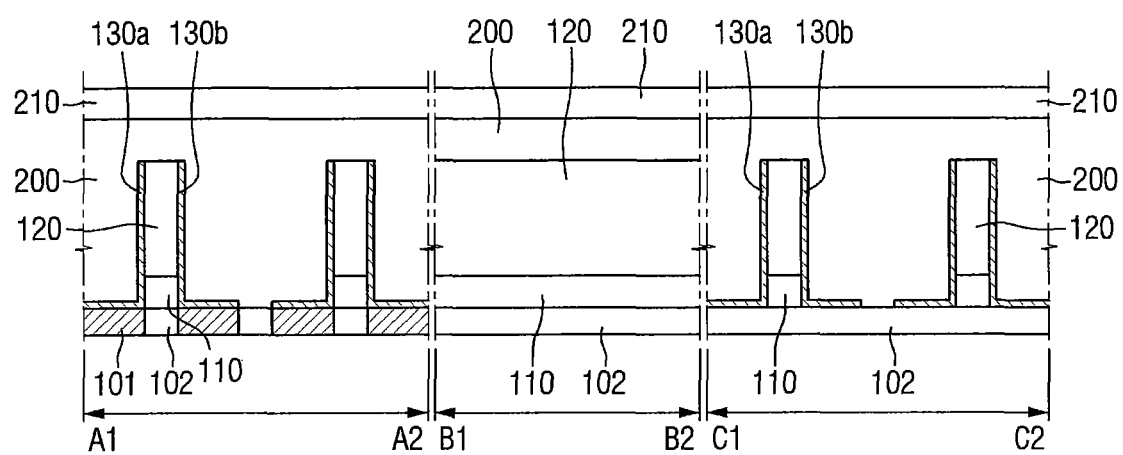
Figure 21:
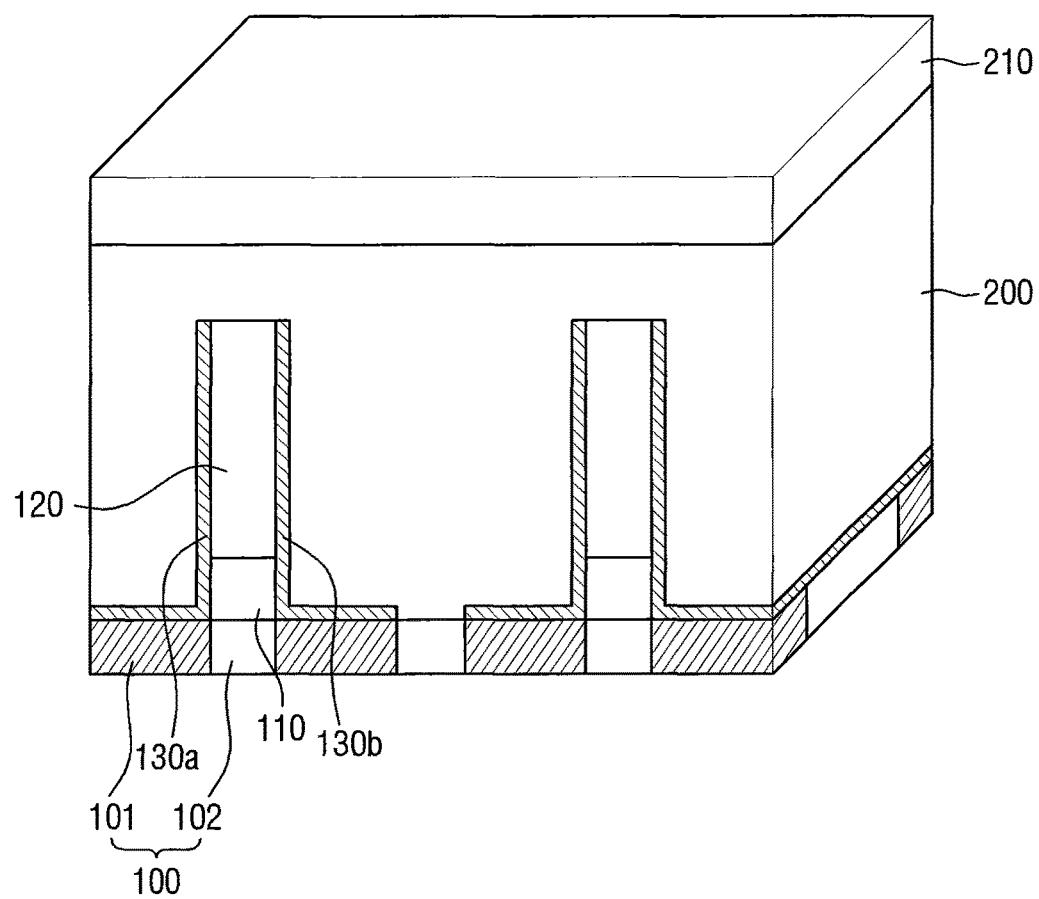
Figure 22:
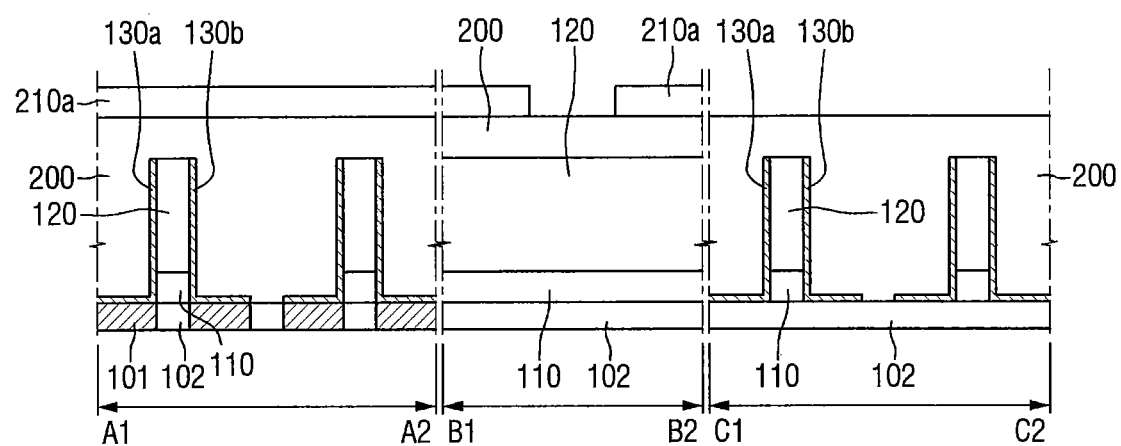
Figure 23:
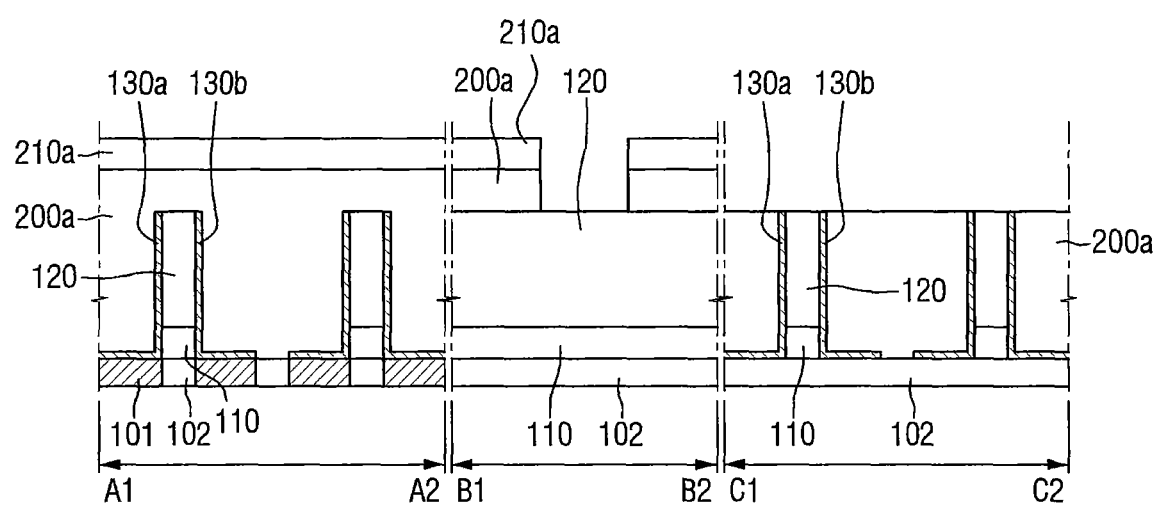
Figure 24:
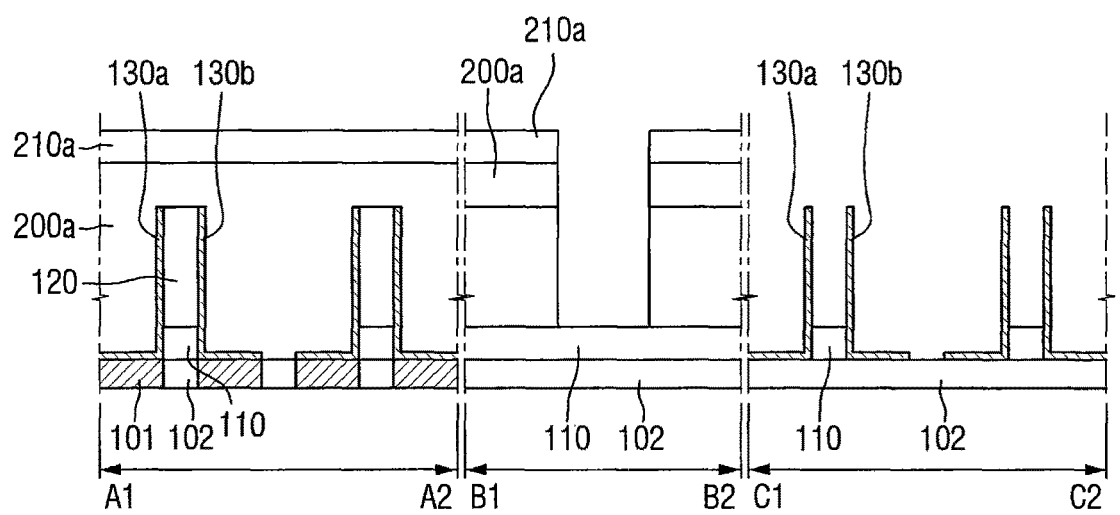
Figure 25:
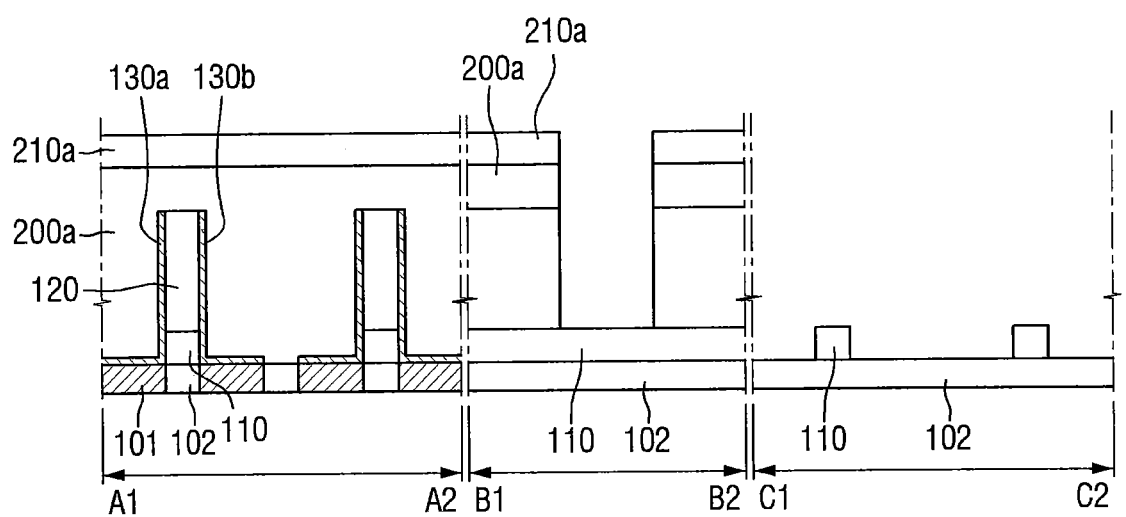

FIG. 20 is a cross-sectional view taken along the lines A1-A2, B1-B2 and C1-C2 of FIG. 2, illustrating a process of depositing a fourth mask layer 200 and a fifth mask layer 210. FIG. 21 is a perspective view of the fourth mask layer 200 and the fifth mask layer 210 deposited in FIG. 20.

Referring to FIG. 20, the fourth mask layer 200 is deposited to fill a space between the lower electrode patterns 130a and 130b, and the fifth mask layer 210 is deposited on the fourth mask layer 200. The fourth mask layer 200 may include, e.g., SOH. The fifth mask layer 210 may include, e.g., silicon oxynitride.

Figure 26:
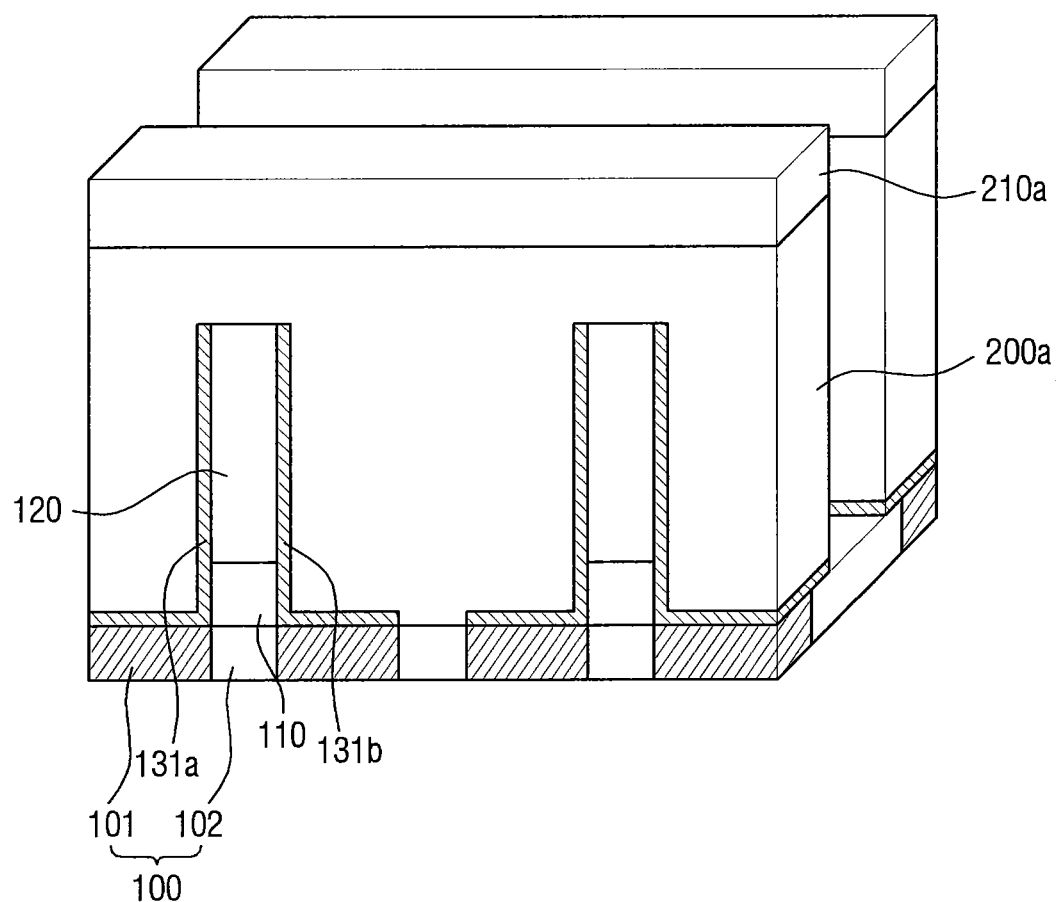

FIGS. 22 through 25 are cross-sectional views taken along the lines A1-A2, B1-B2 and C1-C2 of FIG. 2, illustrating a process of removing the fourth mask layer 200 and the fifth mask layer 210 and partially removing the lower electrode patterns 130a and 130b. FIG. 26 is a perspective view of the resultant structure following the partial removal of the lower electrode patterns 130a and 130b in FIG. 25.

Referring to FIGS. 22 through 25, a fifth mask layer pattern 210a is formed by partially removing the fifth mask layer 210 using a lithography process, and the fourth mask layer 200 is partially removed using the fifth mask layer pattern 210a as a mask. Accordingly, a fourth mask layer pattern 200a is formed, and the insulating patterns 120 are partially removed using the fifth mask layer pattern 210a and the fourth mask layer pattern 200a as a mask. In addition, the lower electrode patterns 130a and 130b are partially removed, and the insulating layers 110 are partially removed. Accordingly, as illustrated in FIG. 26, the lower electrode patterns 130a and 130b are cut in a direction intersecting a direction in which the insulating patterns 120 extend.

Figure 27:
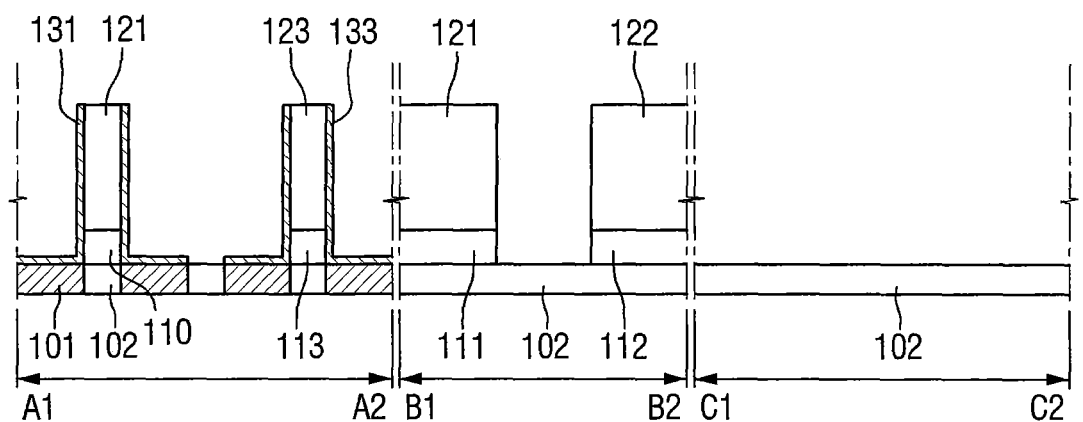
Figure 28:
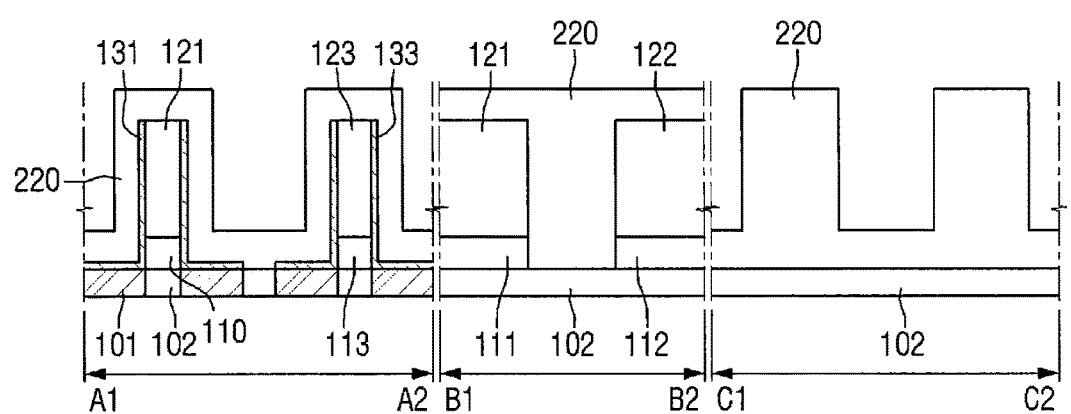
Figure 29:
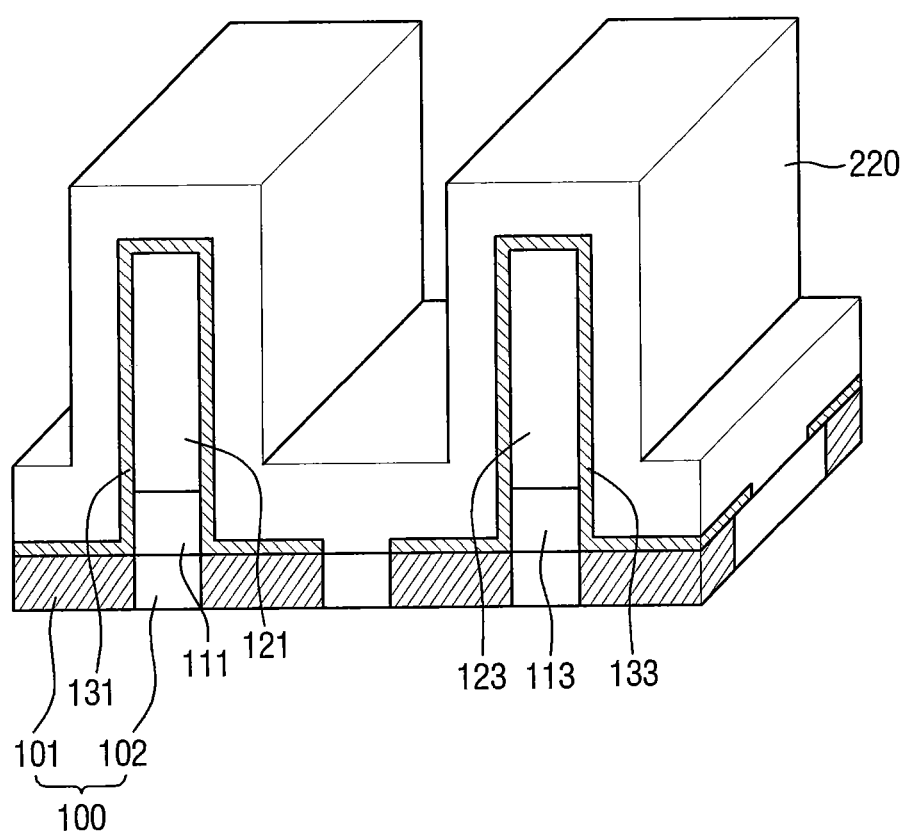

FIGS. 27 and 28 are cross-sectional views taken along the lines A1-A2, B1-B2 and C1-C2 of FIG. 2, illustrating first through fourth lower electrodes 131 through 134 and a dielectric layer pattern 220 formed on the first through fourth lower electrodes 131 through 134. FIG. 29 is a perspective view of the resultant structure following the formation of the dielectric layer pattern 220 in FIG. 28.

Figure 30:
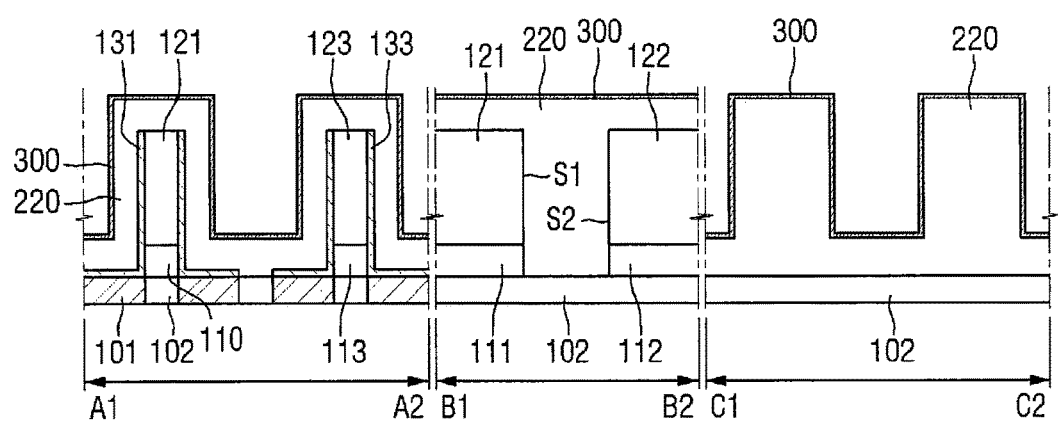

FIG. 30 is a cross-sectional view taken along the lines A1-A2, B1-B2 and C1-C3, illustrating an upper electrode 300 conformally deposited on the dielectric layer pattern 220.

Referring to FIG. 30, in semiconductor devices according to embodiments of the present inventive concepts, a first insulating pattern 121 and a third insulating pattern 123 are disposed on the substrate 100 to be separated from each other. In addition, the first lower electrode 131 and the third lower electrode 133 are not formed on a first surface S1 of the first insulating pattern 121 and a second surface S2 of the second insulating pattern 122, respectively, wherein the first surface S1 and the second surface S2 face each other. This is because the lower electrode patterns 130a and 130b are partially removed by a cutting or other separating process performed in a direction intersecting a direction in which the first insulating pattern 121 or the third insulating pattern 123 extends, such that the insulating pattern of each of the capacitor structures are separate or discontinuous structures. Accordingly, the first through fourth lower electrodes 131 through 134 separated from each other may be formed.

Referring to the B1-B2 cross-section of FIG. 30, an upper surface of the upper electrode 300 is higher than an upper surface of the first insulating pattern 121 or the second insulating pattern 122. If the upper surface of the upper electrode 300 is lower than the upper surface of the first insulating pattern 121 or the second insulating pattern 122, parasitic capacitance may be generated between adjacent capacitors, thereby reducing the operating reliability of semiconductor devices.

Referring to FIG. 30, each of the first insulating pattern 121 and the third insulating pattern 123 is shaped like a square pillar. This is different from a conventional cylindrical pillar structure, and the slope of sidewalls of the first insulating pattern 121 or the third insulating pattern 123 may vary according to process.

Figure 31:
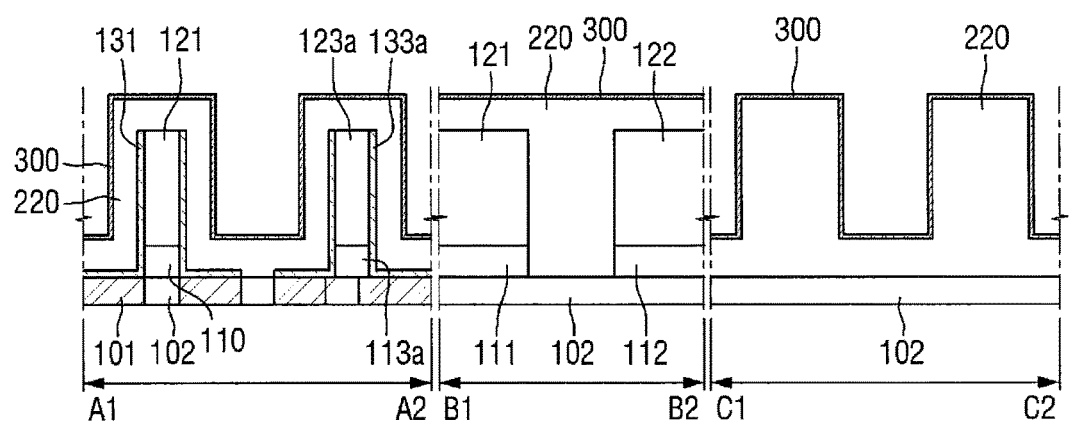
FIG. 31 is a cross-sectional view of semiconductor devices according to embodiments of the present inventive concepts.

FIG. 31 is a cross-sectional view of semiconductor devices according to embodiments of the present inventive concepts.

Referring to FIG. 31, an insulating pattern 123a may at least partially overlap a corresponding contact node 101 disposed thereunder. Depending on processes, the insulating pattern 123a may not be completely asymmetrically aligned with the corresponding contact node 101. However, the insulating pattern 123a may not substantially overlap with the corresponding contact node 101.

Since the insulating pattern 123a at least partially overlaps the corresponding contact node 101 disposed thereunder, an insulating layer 113a formed between the insulating pattern 123a and a substrate 100 may also overlap the corresponding contact node 101 disposed thereunder.

In addition, a lower electrode 133a formed on sidewalls of the insulating pattern 123a may overlap a corresponding insulating layer 102 disposed thereunder. Other components excluding the above components are substantially identical to those described above.

Figure 32:
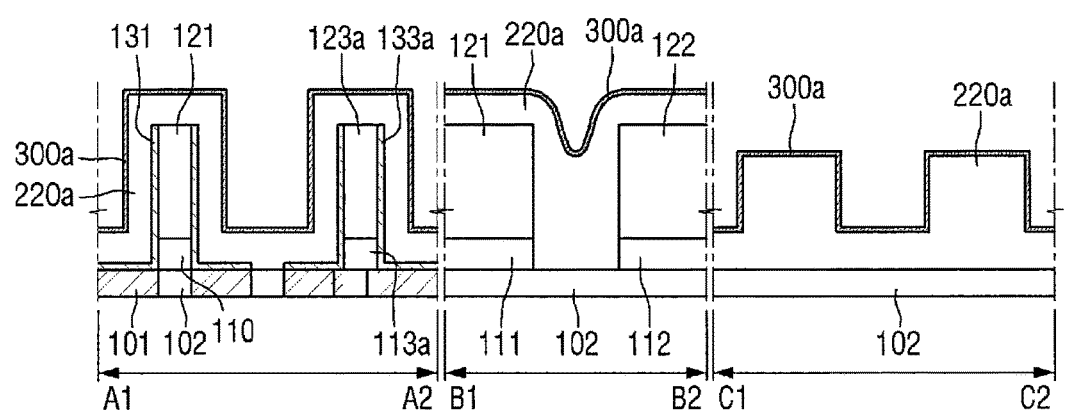
FIG. 32 is a cross-sectional view of semiconductor devices according to embodiments of the present inventive concepts.

FIG. 32 is a cross-sectional view of semiconductor devices according to embodiments of the present inventive concepts.

Referring to the B1-B2 cross-section of FIG. 32, a dielectric layer pattern 220a which fills a space between a first insulating pattern 121 and a second insulating pattern 122 may be concave. Depending on processes, this structure may be created in the process of filling the space between the first insulating pattern 121 and the second insulating pattern 122 in an area in which a distance between the first insulating pattern 121 and the second insulating pattern 122 is relatively large.

Unlike the illustration in FIG. 32, the dielectric layer pattern 220a which fills the space between the first insulating pattern 121 and the second insulating pattern 122 may be concave to a greater degree. A height of the dielectric layer pattern 220a which fills the space between the first insulating pattern 121 and the second insulating pattern 122 may be lower than a height of an upper surface of the first insulating pattern 121 or the second insulating pattern 122. Other components excluding the above components are substantially identical to those described above.

Figure 33:
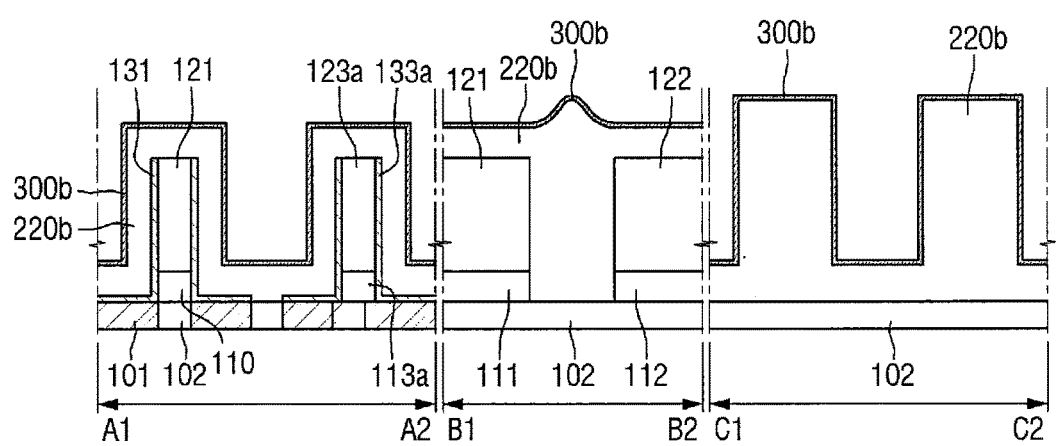
FIG. 33 is a cross-sectional view of semiconductor devices according to embodiments of the present inventive concepts.

FIG. 33 is a cross-sectional view of semiconductor devices according to embodiments of the present inventive concepts.

Referring to the B1-B2 cross-section of FIG. 33, a dielectric layer pattern 220b which fills a space between a first insulating pattern 121 and a second insulating pattern 122 may be convex. Depending on processes, this structure may be created in the process of filling the space between the first insulating pattern 121 and the second insulating pattern 122 in an area in which a distance between the first insulating pattern 121 and the second insulating pattern 122 is relatively small.

Unlike the illustration in FIG. 33, the dielectric layer pattern 220a which fills the space between the first insulating pattern 121 and the second insulating pattern 122 may be convex to a greater degree. Other components excluding the above components are substantially identical to those described above.

FIG. 34 is a layout view of semiconductor devices according to embodiments of the present inventive concepts.

Referring to FIG. 34, first through fourth insulating patterns 121 through 124 and first through fourth lower electrodes 131 through 134 are formed on a substrate 100.

Here, each of the first through fourth insulating patterns 121 through 124 does not overlap a corresponding contact node 101 disposed thereunder, and the first through fourth insulating patterns 121 through 124 are separated from each other.

For example, the first insulating pattern 121 and the second insulating pattern 122 are separated from each other in a first direction DR11, the first insulating pattern 121 and the third insulating pattern 123 are separated from each other in a second direction DR12, the third insulating pattern 123 and the fourth insulating pattern 124 are separated from each other in the first direction DR11, and the second insulating pattern 122 and the fourth insulating pattern 124 are separated from each other in the second direction DR12.

The first lower electrode 131 is formed along both sidewalls of the first insulating pattern 121 in a height direction of the first insulating pattern 121 and is not formed on the other sidewalls of the first insulating pattern 121 which are adjacent to the sidewalls on which the first lower electrode 131 is formed. In addition, the first lower electrode 131 is formed on the substrate 100 along the second direction DR12 and is not formed on an upper surface of the first insulating pattern 121. That is, the other sidewalls and upper surface of the first insulating pattern 121 are free of the first lower electrode 131.

Likewise, the second lower electrode 132 is formed along both sidewalls of the second insulating pattern 122 in a height direction of the second insulating pattern 122 and is not formed on the other sidewalls of the second insulating pattern 122 which are adjacent to the sidewalls on which the second lower electrode 132 is formed. In addition, the second lower electrode 132 is formed on the substrate 100 along the second direction DR12 and is not formed on an upper surface of the second insulating pattern 122.

The third lower electrode 133 and the fourth lower electrode 134 are formed in the same structure as the first lower electrode 131. According to this structure, the first through fourth lower electrodes 131 through 134 are separated and electrically isolated from each other.

A dielectric layer pattern 220 may be formed on the substrate 100, the first through fourth insulating patterns 121 through 124, and the first through fourth lower electrodes 131 through 134. This configuration can be understood from FIG. 29.

An upper electrode 300 may be formed on the dielectric layer pattern 220. This configuration can be understood from FIG. 2. The dielectric layer pattern 220 and the upper electrode 300 are substantially identical to those described above.

Figure 35:
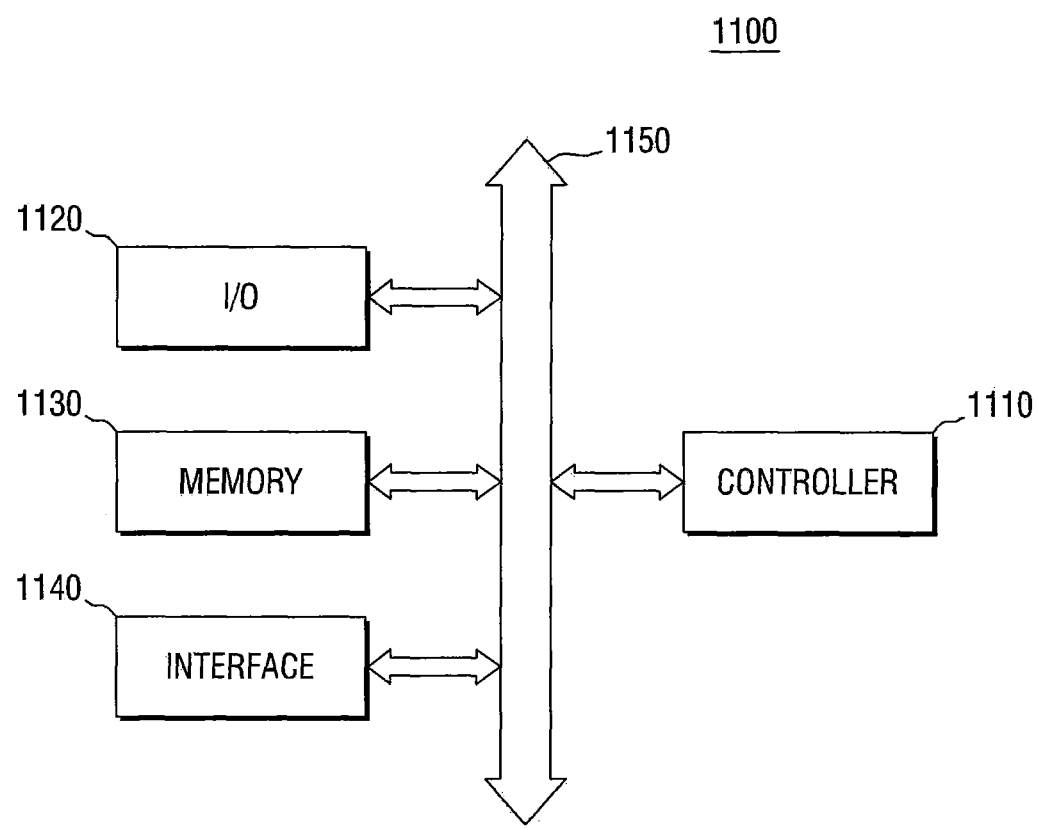
FIG. 35 is a block diagram of an example electronic system including semiconductor devices according to embodiments of the present inventive concepts.

FIG. 35 is a block diagram of an example electronic system 1100 including semiconductor devices according to embodiments of the present inventive concepts.

Referring to FIG. 35, the electronic system 1100 according to embodiments of the present inventive concepts may include a controller 1110, an input/output (I/O) device 1120, a memory device 1130, an interface 1140, and a bus 1150.

The controller 1110, the I/O device 1120, the memory device 1130, and/or the interface 1140 may be coupled to each other through the bus 1150.

The bus 1150 may serve as a path for transmitting data.

The controller 1110 may include one or more of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The memory device 1130 may include semiconductor devices according to embodiments of the present inventive concepts. The memory device 1130 may include a dynamic random access memory (DRAM). The interface 1140 may be used to transmit data to and/or receive data from a communication network. The interface 1140 may be a wired or wireless interface. In an example, the interface 1140 may include an antenna or a wired or wireless transceiver.

The electronic system 1100 may be applied to nearly all types of electronic products capable of transmitting and/or receiving information in a wireless environment, such as a personal data assistant (PDA), a portable computer, a web tablet, a wireless phone, a mobile phone, a digital music player, a memory card, etc.

Figure 36:
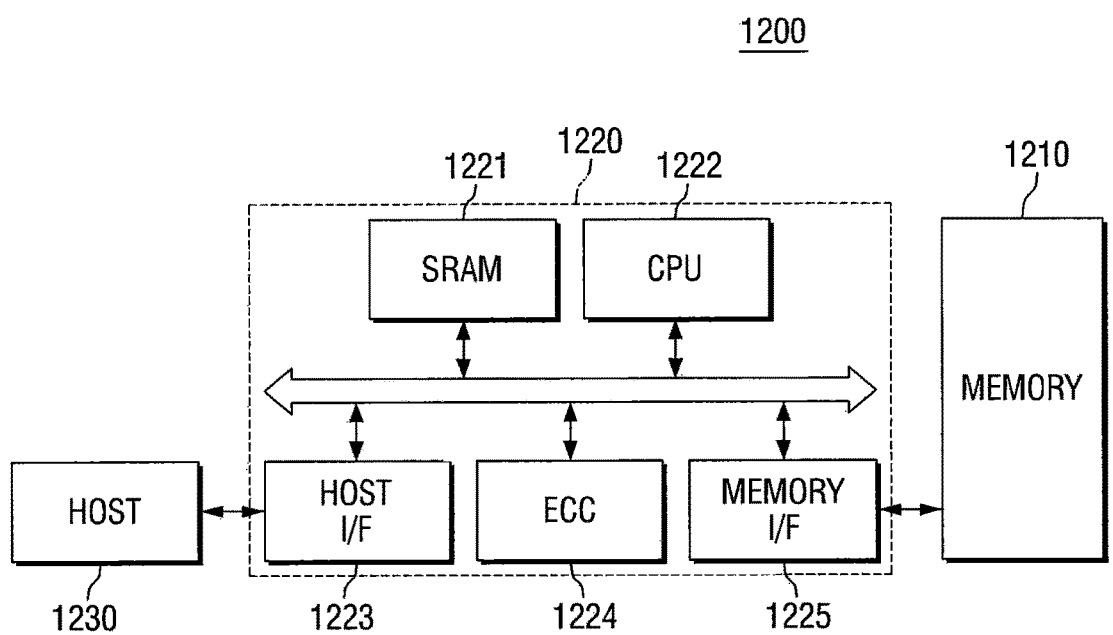
FIG. 36 is a block diagram of an example memory card including semiconductor devices according to embodiments of the present inventive concepts.

FIG. 36 is a block diagram of an example memory card 1200 including semiconductor devices according to embodiments of the present inventive concepts.

Referring to FIG. 36, a memory 1210 including semiconductor devices according to embodiments of the present inventive concepts can be employed in the memory card 1200. The memory card 1200 may include a memory controller 1220 which controls data exchange between a host 1230 and the memory 1210.

A static random access memory (SRAM) 1221 may be used as a working memory of a central processing unit (CPU) 1222. A host interface 1223 may include protocols used by the host 1230 to access the memory card 1200 and exchange data with the memory card 1200.

An error correction code (ECC) 1224 may detect errors in data read from the memory 1210 and correct the detected errors. A memory interface 1225 may interface with the memory 1210.

The CPU 1222 may control the overall operation of the memory controller 1220 related to data exchange.

Figure 37:
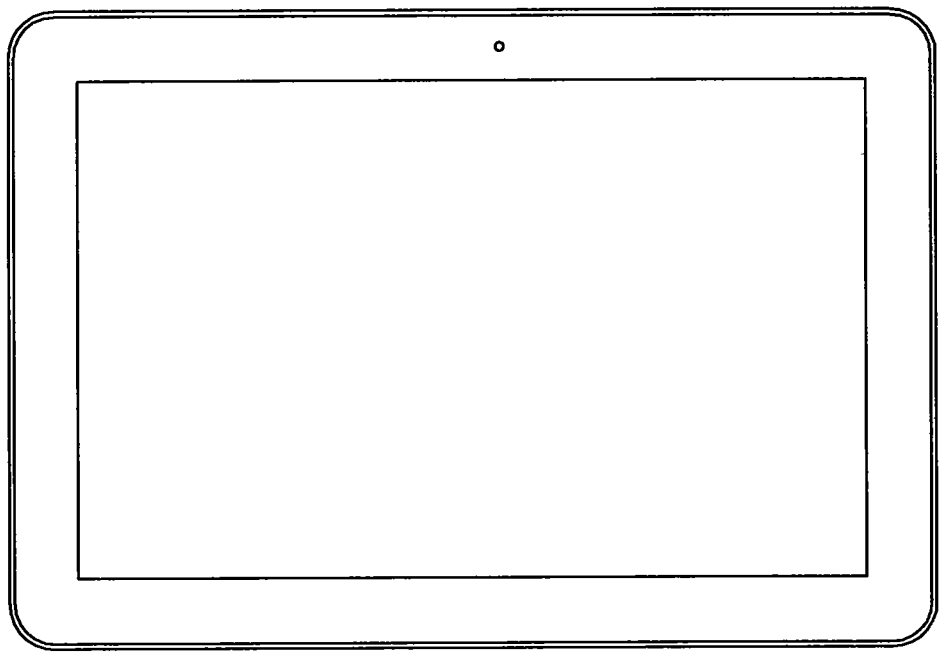
FIGS. 37 through 39 are diagrams illustrating examples of a semiconductor system to which semiconductor devices according to embodiments of the present inventive concepts can be applied.
Figure 38:
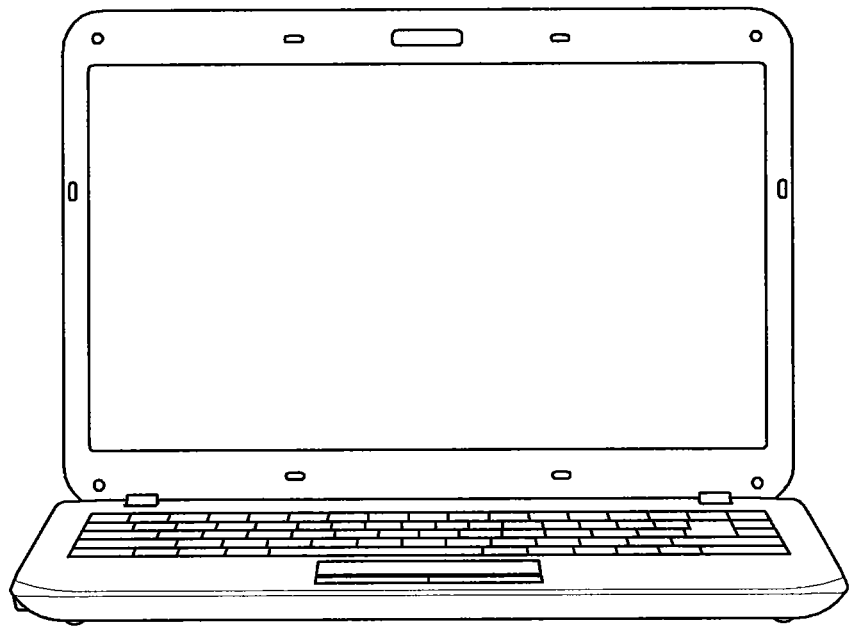
Figure 39:
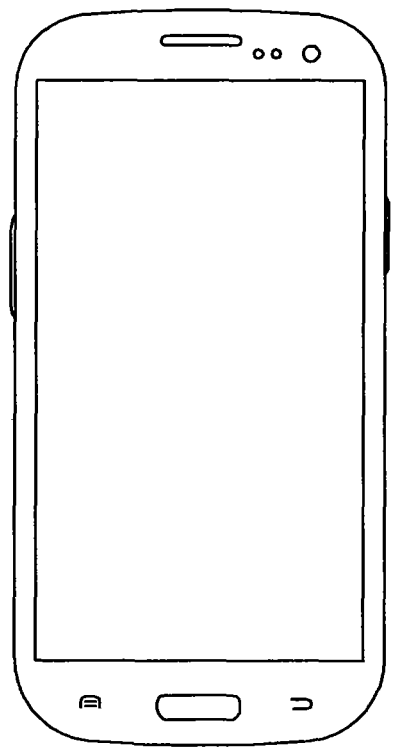

FIGS. 37 through 39 are diagrams illustrating examples of a semiconductor system to which semiconductor devices according to embodiments of the present inventive concepts can be applied.

FIG. 37 illustrates a tablet personal computer (PC) 1500, FIG. 38 illustrates a notebook computer 1300, and FIG. 39 illustrates a smartphone 1400. At least one of the semiconductor devices according to embodiments of the present inventive concepts, as set forth herein, may be used in the tablet PC 1500, the notebook computer 1300, the smartphone 1400, etc.

Semiconductor devices according to embodiments of the present inventive concepts, as set forth herein, may also be applied to various IC devices other than those set forth herein. That is, while the tablet PC 1500, the notebook computer 1300 and the smartphone 1400 have been described above as examples of the semiconductor system according to embodiments of the present inventive concepts, the examples of the semiconductor system according to embodiments are not limited to the tablet PC 1500, the notebook computer 1300, and the smartphone 1400.

In some embodiments of the present inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present inventive concepts has been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device having a capacitor comprising:
   a substrate which has a transistor;
   first and second insulating patterns which are on the substrate and separated from each other;
   a first lower electrode which is on a first surface of the first insulating pattern and is not formed on a second surface of the first insulating pattern adjacent to the first surface;
   a second lower electrode which is not on a third surface of the second insulating pattern which faces the second surface and is on a fourth surface of the second insulating pattern adjacent to the third surface;
   a dielectric layer pattern which is on the second and third surfaces to fill a space between the first and second insulating patterns; and
   an upper electrode which is on the dielectric layer pattern.

2. The semiconductor device of claim 1, wherein an upper surface of the upper electrode is higher than upper surfaces of the first and second insulating patterns.

3. The semiconductor device of claim 1, wherein the dielectric layer pattern between the first and second insulating patterns is lower than upper surfaces of the first and second insulating patterns.

4. The semiconductor device of claim 1, wherein the first insulating pattern is separated from the second insulating pattern.

5. The semiconductor device of claim 1, further comprising:
   a first insulating layer between the first insulating pattern and the substrate; and
   a second insulating layer between the second insulating pattern and the substrate.

6. The semiconductor device of claim 1, wherein each of the first insulating pattern and the second insulating pattern is shaped like a square pillar in plan view.

7. The semiconductor device of claim 1, wherein the first lower electrode is not on an upper surface of the first insulating pattern, and the second lower electrode is not on an upper surface of the second insulating pattern.

8. A semiconductor device having a capacitor comprising:
   a first insulating pattern which is on a substrate;
   a second insulating pattern which is on the substrate and separated from the first insulating pattern in a first direction;
   a first lower electrode extending along sidewalls of the first insulating pattern in a height direction of the first insulating pattern and along the substrate in a second direction intersecting the first direction;
   a second lower electrode extending along sidewalls of the second insulating pattern in a height direction of the second insulating pattern and along the substrate in the second direction;
   a dielectric layer pattern which is on the first and second lower electrodes and between the first and second insulating patterns; and
   an upper electrode which is on the dielectric layer pattern.

9. The semiconductor device of claim 8, wherein the first lower electrode and the second lower electrode are separated from each other in the first direction.

10. The semiconductor device of claim 8, further comprising:
    a first insulating layer which is between the first insulating pattern and the substrate; and
    a second insulating layer which is between the second insulating pattern and the substrate.

11. The semiconductor device of claim 10, wherein the first insulating layer and the second insulating layer are separated from each other in the first direction.

12. A semiconductor device, comprising:
    a substrate including transistors thereon, an interlayer insulating layer on the transistors, and contact nodes extending along a surface of the interlayer insulating layer, wherein the contact nodes are electrically coupled to respective source/drain regions of the transistors; and
    capacitor structures on the surface of the interlayer insulating layer, the capacitor structures respectively comprising:
       an insulating pattern protruding away from the surface of the interlayer insulating layer; and
       a lower electrode on opposing sidewalls of the insulating pattern,
       wherein the insulating pattern is a distinct structure from that of an adjacent one of the capacitor structures,
       wherein the insulating pattern is positioned between respective ones of the contact nodes on the surface of the interlayer insulating layer, and
       wherein the opposing sidewalls of the insulating pattern including the lower electrode thereon are coplanar with those of the adjacent one of the capacitor structures.

13. The semiconductor device of claim 12, wherein the opposing sidewalls of the insulating pattern comprise first opposing sidewalls that are aligned with those of the adjacent one of the capacitor structures along a first direction, and
    wherein the insulating pattern further comprises a second sidewall extending between the first opposing sidewalls thereof along a second direction intersecting the first direction, wherein the second sidewall faces that of the adjacent one of the capacitor structures.

14. The semiconductor device of claim 13, wherein the capacitor structures further comprise a dielectric layer pattern on the lower electrode, and an upper electrode on the dielectric layer pattern, wherein the dielectric layer pattern and the upper electrode continuously extend between the capacitor structures on the substrate.

15. The semiconductor device of claim 14, wherein the second sidewall of the insulating pattern includes the dielectric layer pattern thereon but is free of the lower electrode.

16. The semiconductor device of claim 15, wherein the insulating pattern does not overlap with the respective ones of the contact nodes in plan view, and wherein an upper surface of the insulating pattern is free of the lower electrode such that the lower electrode comprises first and second conductive portions that electrically contact the respective ones of the contact nodes and are electrically isolated from each other.

17. The semiconductor device of claim 16, wherein a portion of the dielectric layer pattern extending between capacitor structures comprises a concave portion that extends towards the substrate beyond the upper surfaces of the insulating pattern, or a convex portion that extends away from the substrate.

18. The semiconductor device of claim 16, wherein:
the first opposing sidewalls of the insulating pattern extend parallel to each other;
the second sidewall of the insulating pattern extend perpendicular to the first opposing sidewalls; and
the first and second conductive portions continuously extend from the first opposing sidewalls of the insulating pattern, respectively, to and along surfaces of the respective ones of the contact nodes.

19. The semiconductor device of claim 16, wherein the capacitor structures further respectively comprise:
an insulating layer between the insulating pattern and the surface of the interlayer insulating layer, wherein the insulating layer extends between and does not overlap with the respective ones of the contact nodes in plan view.

20. The semiconductor device of claim 15, wherein the dielectric layer pattern comprises a material having a dielectric constant of about 1000 or more.

\* \* \* \* \*